US009530619B2

(12) United States Patent
Okunishi

(10) Patent No.: US 9,530,619 B2
(45) Date of Patent: Dec. 27, 2016

(54) PLASMA PROCESSING APPARATUS AND FILTER UNIT

(71) Applicant: TOKYO ELECTRON LIMITED, Tokyo (JP)

(72) Inventor: Naohiko Okunishi, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/786,590

(22) PCT Filed: May 19, 2014

(86) PCT No.: PCT/JP2014/002614
§ 371 (c)(1),
(2) Date: Oct. 23, 2015

(87) PCT Pub. No.: WO2014/188696
PCT Pub. Date: Nov. 27, 2014

(65) Prior Publication Data
US 2016/0079038 A1 Mar. 17, 2016

(30) Foreign Application Priority Data
May 24, 2013 (JP) .................... 2013-110201

(51) Int. Cl.
*H01J 7/24* (2006.01)
*H05B 31/26* (2006.01)
(Continued)

(52) U.S. Cl.
CPC .... *H01J 37/32174* (2013.01); *H01J 37/32091* (2013.01); *H01J 37/32798* (2013.01);
(Continued)

(58) Field of Classification Search
CPC .............. H01J 37/32174; H01J 37/32091;
H01J 37/32798; H01J 2237/334; H01J 37/32165; H01J 37/3211; H03H 7/38; H03H 1/46; H05H 2001/4682
(Continued)

(56) References Cited

U.S. PATENT DOCUMENTS

2015/0235809 A1* 8/2015 Ito ................... H01J 37/32165
156/345.48

FOREIGN PATENT DOCUMENTS

JP 2011-135052 A 7/2011

OTHER PUBLICATIONS

International Search Report from International Application No. PCT/JP2014/002614 mailed Jul. 1, 2014.

* cited by examiner

*Primary Examiner* — Daniel D Chang
(74) *Attorney, Agent, or Firm* — Brundidge & Stanger, P.C.

(57) ABSTRACT

A filter unit 54(IN) includes a housing 82 formed of a cylindrical conductor. Further, in the housing 82, the air-core solenoid coils $AL_1$ and $BL_1$; the first capacitors $AC_1$ and $BC_1$; the troidal coils $AL_2$ and $BL_2$; and the second capacitors $AC_2$ and $BC_2$ are arranged in this sequence from top to bottom. In the vicinity of the air-core solenoid coils $AL_1$ and $BL_1$, a multiple number of rod-shaped comb-teeth members 86, which are extended in parallel to a coil axis direction, are provided adjacent to outer peripheries of the air-core solenoid coils $AL_1$ and $BL_1$ at a regular interval in a circumferential direction thereof. A comb teeth M are formed on an inner surface of each comb-teeth member 86, and the comb teeth M are inserted into winding gaps of the air-core solenoid coils $AL_1$ and $BL_1$.

17 Claims, 15 Drawing Sheets

(51) Int. Cl.
      *H01J 37/32*       (2006.01)
      *H05H 1/46*       (2006.01)
      *H03H 7/38*       (2006.01)

(52) U.S. Cl.
      CPC ................ *H03H 7/38* (2013.01); *H05H 1/46* (2013.01); *H01J 2237/334* (2013.01); *H05H 2001/4682* (2013.01)

(58) Field of Classification Search
      USPC ...... 315/111.21, 111.41, 111.51; 156/345.24, 156/345.29, 345.48; 118/723 R
      See application file for complete search history.

PLASMA PROCESSING APPARATUS AND FILTER UNIT

CROSS-REFERENCE TO RELATED APPLICATION

This Application is a U.S. national phase application under 35 U.S.C. §371 of PCT Application No. PCT/JP2014/002614 filed on May 19, 2014, which claims the benefit of Japanese Patent Application No. 2013-110201 filed on May 24, 2013, the entire disclosures of which are incorporated herein by reference.

TECHNICAL FIELD

The embodiments described herein pertain generally to a plasma processing apparatus configured to perform a plasma process on a processing target substrate by using a high frequency power; and, more particularly, to a plasma processing apparatus equipped with a filter for blocking a high frequency noise introduced into a line such as a power feed line or a signal line from an electrical member other than a high frequency electrode within a processing vessel.

BACKGROUND ART

In micro-processing for manufacturing a semiconductor device or a FPD (Flat Panel Display) using plasma, it is very important to control a temperature or a temperature distribution of a processing target substrate (a semiconductor wafer, a glass substrate, etc.) as well as to control a plasma density distribution on the processing target substrate. If the temperature control of the substrate is not properly performed, not only the uniformity of a surface reaction of the substrate but also the uniformity of process characteristics may not be achieved, so that a production yield of semiconductor devices or display devices is decreased.

In general, a mounting table or susceptor, which mounts thereon a processing target substrate within a chamber of a plasma processing apparatus (particularly, a capacitively coupled plasma processing apparatus), has a function as a high frequency electrode that applies a high frequency power into a plasma space, a function as a holder that holds thereon the substrate by electrostatic attraction or the like, and a function as a temperature controller that controls the temperature of the substrate to a preset temperature through heat transfer. As for the temperature control function, it is required to appropriately correct a heat input characteristic distribution of the substrate affected by non-uniform radiant heat from plasma or a wall of the chamber, or a heat distribution affected by a substrate supporting structure.

Conventionally, in order to control the temperature of the susceptor and, further, the temperature of the substrate, a heater structure is widely employed. In this heater structure, a heating element that generates heat by an electric current applied thereto is provided in the susceptor, and Joule heat generated by the heating element is controlled. When using this heater structure, however, a part of a high frequency power applied to the susceptor from a high frequency power supply may be easily introduced into a heater power feed line through the heating element as a noise. If this high frequency noise reaches a heater power supply through the heater power feed line, operation and performance of the heater power supply is degraded. Furthermore, if a high frequency current flows in the heater power feed line, the high frequency power may be wasted. Typically, to solve these problems, a filter that reduces or blocks the high frequency noise flowing from the heating element embedded in the susceptor is provided on the heater power feed line. Typically, this kind of filter is provided outside the chamber (processing vessel) to be located directly under the susceptor.

The present applicant describes, in Patent Document 1, a filter technique that provides improved filter performance for blocking a high frequency noise introduced to a line such as a power feed line or a signal line from an electrical member other than a high frequency electrode within a processing vessel of a plasma processing apparatus. This filter technique employs a regular multiple parallel resonance characteristic of a distributed constant line. Accordingly, only one air coil is provided within the filter.

Patent Document 1: Japanese Patent Laid-open Publication No. 2011-135052

DISCLOSURE OF THE INVENTION

Problems to be Solved by the Invention

In the capacitively coupled plasma processing apparatus, in order to improve function and controllability of the high frequency power in the plasma process, multiple high frequency powers of different frequencies are often applied to the electrode within the processing vessel. By way of example, in an apparatus of applying dual high frequency powers to a lower electrode, a first high frequency power HF having a relatively high basic frequency (typically, 27 MHz or higher) suitable for plasma generation and a second high frequency power having a relatively low basic frequency (typically, 13 MHz or less) suitable for controlling energy of ions attracted to a processing target substrate from plasma are both applied to a susceptor (lower electrode) on which the processing target substrate is mounted. In this case, noises of the first and second high frequency powers HF and LF are introduced into a heater power feed line at the same time through a heating element which is embedded in the susceptor to control a temperature of the processing target substrate. A filter provided on the heater power feed line is required to block the high frequency noises of the two different high frequency powers at the same time.

In the filter described in Patent Document 1, inductance required for an air core coil, i.e., a size of the coil (particularly, a length of the coil in an axial direction) is determined based on the basic frequency of the second high frequency power LF, which is the lowest frequency among the frequencies to be blocked. The lower the basic frequency of the second high frequency power LF is, the longer the length of the coil needs to be. For example, when the basic frequency of the second high frequency power LF is 3.2 MHz, the length of the coil needs to be 200 mm or larger, whereas when the basic frequency of the second high frequency power LF is 400 kHz, the length of the coil needs to be 750 mm or larger. If the size of the air core coil increases, however, resistance of a conducting wire of the coil also increases, so that Joule heat generated when an electric current from a heater power supply flows is increased. As a consequence, a power loss within the filter is increased. Furthermore, if the size of the air core coil, i.e., the filter size is increased, it may be difficult to design a layout of various kinds of power supply systems provided under the susceptor or a chamber.

In addition, in the filter described in Patent Document 1, there is obtained a frequency-impedance characteristic in which multiple parallel resonance frequencies appear at a substantially constant frequency interval due to multiple parallel resonance of a distributed constant line formed by the air core coil and a cylindrical outer conductor surrounding the air core coil. Since, however, these parallel resonance frequencies are obtained at the regular frequency interval, it is very difficult to match the multiple parallel resonance with the frequencies of the two high frequency powers HF and LF at the same time, which are selected in consideration of various aspects such as the kind or specification of a process involved.

Particularly, if the filter of Patent Document 1 is designed to match the lowest parallel resonance frequency of the multiple parallel resonance with the basic frequency of the second high frequency power LF set to be of a low value, e.g., 3.2 MHz or 400 kHz, the air core coil is scaled up as described above, and there is obtained a frequency-impedance characteristic in which an interval between the resonance frequencies is very small and a gradient (change rate) is sharp. For this reason, if there is even a slight error or non-uniformity in the filter design, the basic frequency to be blocked is affected by a next serial resonance frequency rather than a parallel resonance frequency, so that remarkably low impedance may be obtained, and a filter function may not be properly exerted. Accordingly, design, manufacture and control of the filter may be difficult, and an apparatus difference on a plasma processing apparatus level may be easily generated.

In view of the foregoing problems, exemplary embodiments provide a plasma processing apparatus and a filter unit capable of improving reproducibility and reliability of a plasma process by applying sufficiently high impedance efficiently, stably and securely to undesired high frequency noises of multiple frequencies, which are introduced into a line such as a power feed line or a signal line from an electrical member other than a high frequency electrode within a processing vessel.

Means for Solving the Problems

In a first exemplary embodiment, a plasma processing apparatus includes an external circuit of a power meter or a signal meter electrically connected via a line to an electrical member within a processing vessel in which a plasma process is performed. In the plasma processing apparatus, noises of multiple high frequency powers of different frequencies introduced from the electrical member into the line toward the external circuit are reduced or blocked by a filter provided on the line. Further, the filter includes an air-core solenoid coil provided at an uppermost portion of the filter, when viewed from a side of the electrical member, and configured to block noises of a single or plural high frequency powers among the noises of the multiple high frequency powers except a high frequency power having a lowest frequency; insulating comb teeth inserted in winding gaps of the air-core solenoid coil locally at plural positions in a circumferential direction thereof; a coil having a core connected in series to the air-core solenoid coil, and configured to block a noise of the high frequency power having the lowest frequency; and a cylindrical conductor, accommodating or surrounding at least the air-core solenoid coil, configured to form, by being combined with the air-core solenoid coil, a distributed constant line in which parallel resonance occurs at multiple frequencies.

Within a plasma processing apparatus in which an electrical member within a processing vessel in which a plasma process is performed is electrically connected via a line to an external circuit provided outside the processing vessel, a filter provided on the line is configured to reduce or block noises of multiple high frequency powers of different frequencies introduced from the electrical member into the line toward the external circuit. The filter unit includes an air-core solenoid coil provided at an uppermost portion of the filter, when viewed from a side of the electrical member, and configured to block noises of a single or plural high frequency powers among the noises of the multiple high frequency powers except a high frequency power having a lowest frequency; insulating comb teeth inserted in winding gaps of the air-core solenoid coil locally at plural positions in a circumferential direction thereof; a coil having a core connected in series to the air-core solenoid coil, and configured to block a noise of the high frequency power having the lowest frequency; and a cylindrical conductor, accommodating or surrounding at least the air-core solenoid coil, configured to form, by being combined with the air-core solenoid coil, a distributed constant line in which parallel resonance occurs at multiple frequencies.

In the first exemplary embodiment, the air-core solenoid coil provided at the first stage of the filter blocks the high frequency noise having the higher frequency among the noises of the multiple high frequency powers introduced from the electrical member within the processing vessel into the line toward the external circuit outside the processing vessel, whereas the troidal coil provided at the next stage of the filter blocks the high frequency noise having the lowest frequency having passed through the air-core coil. That is, the air-core solenoid and the troidal coil are configured to perform the filter blocking functions against the high frequency noise having the higher frequency and the high frequency noise having the lower frequency, respectively.

Further, in the first exemplary embodiment, the winding pitch of the air-core solenoid coil is accurately adjusted to a set value by the comb-teeth pitch, so that a frequency-impedance characteristic having high reproducibility and little object difference can be obtained. Furthermore, since air gaps are formed between respective winding gaps of the air-core solenoid coil except where the comb teeth are inserted, heat generated from the coil is rapidly discharged out through the air gaps. Thus, the air-core solenoid coil can be cooled efficiently.

In a second exemplary embodiment, a plasma processing apparatus includes an external circuit of a power meter or a signal meter electrically connected via a line to an electrical member within a processing vessel in which a plasma process is performed. In the plasma processing apparatus, noises of multiple high frequency powers of different frequencies introduced from the electrical member into the line toward the external circuit are reduced or blocked by a filter provided on the line. The filter further includes an air-core solenoid coil provided at an uppermost portion of the filter, when viewed from a side of the electrical member, and configured to block noises of a single or plural high frequency powers among the multiple high frequency powers except a high frequency power having a lowest frequency; insulating comb teeth inserted in winding gaps of a first section of the air-core solenoid coil locally at plural positions in a circumferential direction thereof; a coil tube configured to block winding gaps of a second section of the air-core solenoid coil in the entire circumferential direction; a coil having a core connected in series to the air-core solenoid coil, and configured to block a noise of the high frequency power having the lowest frequency; and a cylindrical conductor, accommodating or surrounding at least the air-core solenoid coil, configured to form, by being combined with the air-core solenoid coil, a distributed constant line in which parallel resonance occurs at multiple frequencies.

Within a plasma processing apparatus in which a heating element provided in a first electrode within a processing vessel in which a plasma process is performed is electrically connected via a power feed line to a heater power supply provided outside the processing vessel, a filter unit provided on the power feed line is configured to reduce or block noises of multiple high frequency powers of different frequencies introduced from the heating element into the power feed line toward the heater power supply. The filter unit includes an air-core solenoid coil provided at an uppermost portion of the filter, when viewed from a side of the heating element, and configured to block noises of a single or plural high frequency powers among the multiple high frequency powers except a high frequency power having a lowest frequency; insulating comb teeth inserted in winding gaps of a first section of the air-core solenoid coil locally at plural positions in a circumferential direction thereof; a coil tube configured to block winding gaps of a second section of the air-core solenoid coil entirely in the circumferential direction; a coil having a core connected in series to the air-core solenoid coil, and configured to block a noise of the high frequency power having the lowest frequency; and a cylindrical conductor, accommodating or surrounding at least the air-core solenoid coil, configured to form, by being combined with the air-core solenoid coil, a distributed constant line in which parallel resonance occurs at multiple frequencies.

In the second exemplary embodiment, the air-core solenoid coil provided at the first stage of the filter blocks the high frequency noise having the higher frequency among the noises of the multiple high frequency powers introduced from the electrical member within the processing vessel into the line toward the external circuit outside the processing vessel, whereas the troidal coil at the next stage of the filter blocks the high frequency noise having the lowest frequency having passed through the air-core solenoid coil. That is, the air-core solenoid and the troidal coil are configured to perform the filter blocking functions against the high frequency noise having the higher frequency and the high frequency noise having the lower frequency, respectively.

Furthermore, in the second exemplary embodiment, first insulating comb teeth are inserted into the winding gaps of the air-core solenoid coil in the first section thereof locally at the plural positions in the circumferential direction thereof, and a second coil tube blocks the winding gaps of the air-core solenoid coil in the second section thereof entirely in the circumferential direction. Accordingly, it is possible to shift a part or all of resonance frequencies of multiple parallel resonance by changing the characteristic impedance in each section, while maintaining a distance interval of the distributed constant line or a coaxial line formed between the air-core solenoid coil and the cylindrical conductor to be uniform.

In a third exemplary embodiment, a plasma processing apparatus includes an external circuit of a power meter or a signal meter electrically connected via a line to an electrical member within a processing vessel in which a plasma process is performed. In the plasma processing apparatus, noises of multiple high frequency powers of different frequencies introduced from the electrical member into the line toward the external circuit are reduced or blocked by a filter provided on the line. Further, the filter includes an air-core solenoid coil provided at an uppermost portion of the filter, when viewed from a side of the electrical member, and configured to block noises of a single or plural high frequency powers among the noises of the multiple high frequency powers except a high frequency power having a lowest frequency; a first coil tube, having a first dielectric constant, configured to block winding gaps of a first section of the air-core solenoid coil entirely in a circumferential direction; a second coil tube, having a second dielectric constant, configured to block winding gaps of a second section of the air-core solenoid coil entirely in the circumferential direction; a coil having a core connected in series to the air-core solenoid coil, and configured to block a noise of the high frequency power having the lowest frequency; and a cylindrical conductor, accommodating or surrounding at least the air-core solenoid coil, configured to form, by being combined with the air-core solenoid coil, a distributed constant line in which parallel resonance occurs at multiple frequencies.

Within a plasma processing apparatus in which an electrical member within a processing vessel in which a plasma process is performed is electrically connected via a line to an external circuit provided outside the processing vessel, a filter unit provided on the line is configured to reduce or block noises of multiple high frequency powers of different frequencies introduced from the electrical member into the line toward the external circuit. Here, the filter unit includes an air-core solenoid coil provided at an uppermost portion of the filter, when viewed from a side of the electrical member, and configured to block noises of a single or plural high frequency powers among the multiple high frequency powers except a high frequency power having a lowest frequency; a first coil tube, having a first dielectric constant, configured to block winding gaps of a first section of the air-core solenoid coil entirely in a circumferential direction; a second coil tube, having a second dielectric constant, configured to block winding gaps of a second section of the air-core solenoid coil entirely in the circumferential direction; a coil having a core connected in series to the air-core solenoid coil, and configured to block a noise of the high frequency power having the lowest frequency; and a cylindrical conductor, accommodating or surrounding at least the air-core solenoid coil, configured to form, by being combined with the air-core solenoid coil, a distributed constant line in which parallel resonance occurs at multiple frequencies.

In the third exemplary embodiment, the air-core solenoid coil provided at the first stage of the filter blocks the high frequency noise having the higher frequency among the noises of the multiple high frequency powers introduced from the electrical member within the processing vessel into the line toward the external circuit outside the processing vessel, whereas the troidal coil provided at the next stage of the filter blocks the high frequency noise having the lowest frequency having passed through the air-core solenoid coil. That is, the air-core solenoid and the troidal coil are configured to perform the filter blocking functions against the high frequency noise having the higher frequency and the high frequency noise having the lower frequency, respectively.

In the third exemplary embodiment, the first coil tube having the first dielectric constant blocks the winding gaps of the air-core solenoid coil in the first section thereof entirely in the circumferential direction, and the second coil tube having the second dielectric constant blocks the winding gaps of the air-core solenoid coil in the second section thereof entirely in the circumferential direction. Accordingly, it is possible to shift a part or all of resonance frequencies of multiple parallel resonance by changing characteristic impedance in each section, while maintaining a distance interval of the distributed constant line or a coaxial line formed between the air-core solenoid coil and the cylindrical conductor to be uniform.

Effect of the Invention

According to the plasma processing apparatus and the filter unit of the exemplary embodiments, with the above-described configuration and operation, it is possible to improve reproducibility and reliability of the plasma process by applying sufficiently high impedance to the high frequency noises of multiple frequencies introduced into the line such as a power feed line or a signal line from the electrical member other than the high frequency electrode within the processing vessel.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following, exemplary embodiments will be described in detail, and reference is made to the accompanying drawings, which form a part of the description.

<Overall Configuration of Plasma Processing Apparatus>

Figure 1:
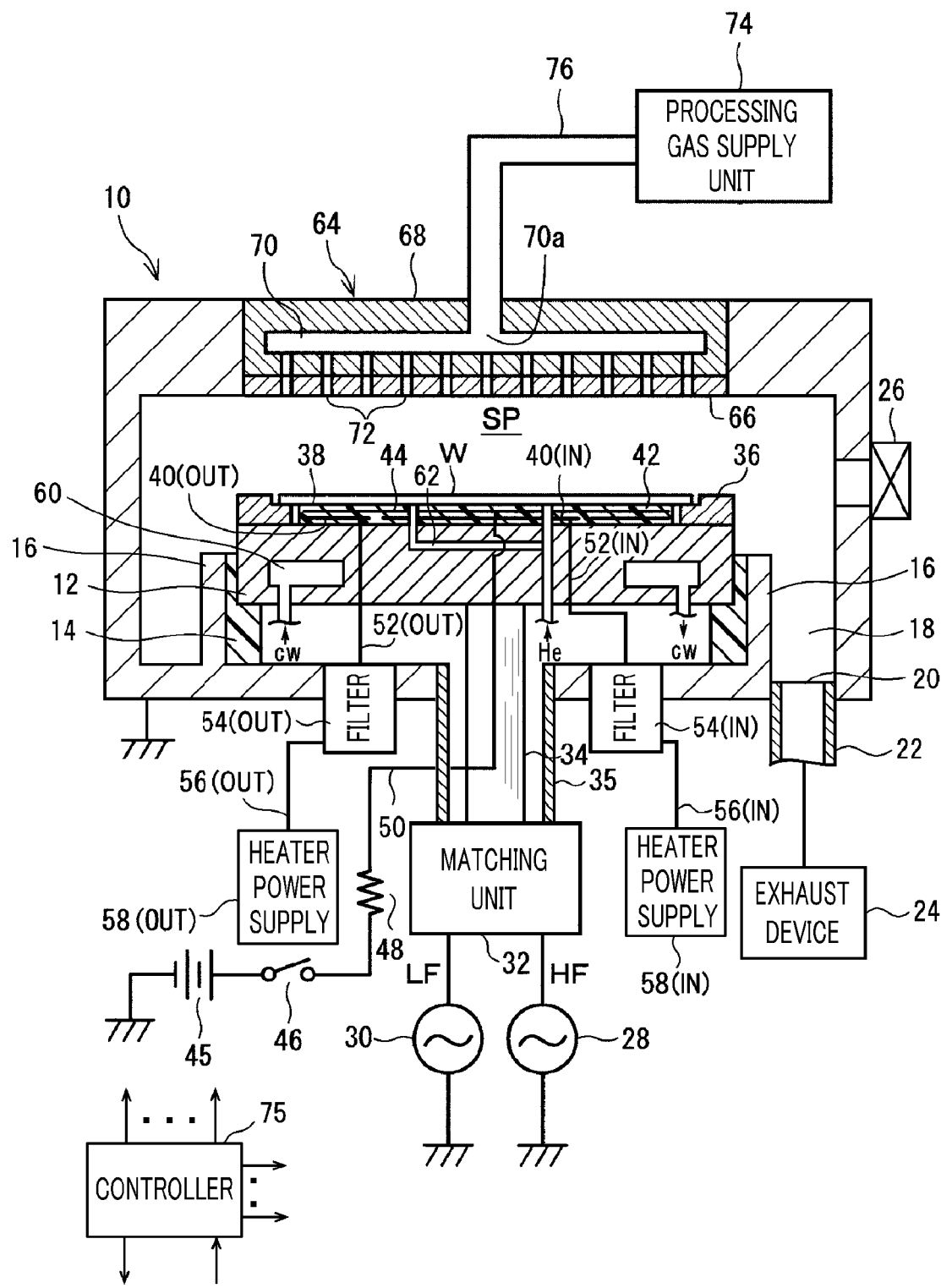
FIG. 1 is a cross sectional view illustrating a configuration of a plasma processing apparatus in accordance with a first exemplary embodiment.

FIG. 1 illustrates a configuration of a plasma processing apparatus in accordance with a first exemplary embodiment. The plasma processing apparatus is configured as a capacitively coupled plasma etching apparatus in which dual frequency powers are applied to a lower electrode. The plasma etching apparatus includes a cylindrical chamber (processing vessel) 10 made of, e.g., a metal material such as aluminum or stainless steel. The chamber 10 is grounded.

A circular plate-shaped susceptor 12 configured to mount thereon a processing target substrate, e.g., a semiconductor wafer W is horizontally disposed as a lower electrode in the chamber 10. The susceptor 12 is made of, but not limited to, aluminum and supported on an insulating cylindrical supporting member 14 without being grounded. The insulating cylindrical supporting member 14 is made of, but not limited to, a ceramic material and vertically extended upwards from a bottom of the chamber 10. An annular exhaust path 18 is formed between an inner wall of the chamber 10 and a conductive cylindrical supporting member 16 that is vertically extended upwards from the bottom of the chamber 10 along a periphery of the insulating cylindrical supporting member 14. An exhaust opening 20 is formed at a bottom of the exhaust path 18, and an exhaust device 24 is connected to the exhaust opening 20 through an exhaust pipe 22. The exhaust device 24 includes a vacuum pump such as a turbo molecular pump and is capable of depressurizing a processing space within the chamber 10 to a required vacuum level. A gate valve 26 configured to open and close a loading/unloading opening for the semiconductor wafer W is provided at a sidewall of the chamber 10.

The susceptor 12 is electrically connected with a first high frequency power supply 28 and a second high frequency power supply 30 via a matching unit 32 and a power feed rod

34. The first high frequency power supply 28 is configured to output a first high frequency power HF of a certain frequency (typically, equal to or higher than, e.g., about 27 MHz) that mainly contributes to plasma generation. Meanwhile, the second high frequency power supply 30 is configured to output a second high frequency power LF of a certain frequency (typically, equal to or lower than, e.g., about 13 MHz) that mainly contributes to ion attraction into the semiconductor wafer W mounted on the susceptor 12. The matching unit 32 accommodates a first matching device and a second matching device (not shown) configured to match impedance between the first and second high frequency power supplies 28 and 30 and a plasma load, respectively.

The power feed rod 34 is made of a cylindrical or columnar conductor having a certain outer diameter. An upper end of the power feed rod 34 is connected to a central portion of a bottom surface of the susceptor 12, and a lower end of the power feed rod 34 is connected to high frequency output terminals of the first and second matching devices within the matching unit 32. Further, a cylindrical conductive cover 35 surrounding the power feed rod 34 is provided between a bottom surface of the chamber 10 and the matching unit 32. To elaborate, a circular opening having a certain diameter larger than the outer diameter of the power feed rod 34 is formed at the bottom surface of the chamber 10. An upper end of the conductive cover 35 is connected to this opening of the chamber while a lower end thereof is connected to ground (returning wire) terminals of the matching devices.

The susceptor 12 has a diameter larger than that of the semiconductor wafer W. A top surface of the susceptor 12 is divided into a central region having the substantially same shape (circular shape) and the substantially same size as those of the wafer W, i.e., a wafer mounting portion; and an annular peripheral region extended outwards from the wafer mounting portion. The semiconductor wafer W as a processing target object is mounted on the wafer mounting portion. A ring-shaped plate member, i.e., a so-called focus ring 36 is mounted on the annular peripheral region. The focus ring 36 has an inner diameter larger than the diameter of the semiconductor wafer W and may be made of, by way of example, but not limitation, one of Si, SiC, C and $SiO_2$ depending on a material of the semiconductor wafer W to be etched.

An electrostatic chuck 38 configured to attract and hold the wafer and a heating element 40 are provided on the wafer mounting portion of the top surface of the susceptor 12. In the electrostatic chuck 38, a DC electrode 44 is embedded within a film-shaped or plate-shaped dielectric member 42 that is formed or fastened on the top surface of the susceptor 12 as one body therewith. The DC electrode 44 is electrically connected with a DC power supply 45 provided at the outside of the chamber 10 via a switch 46, a resistor 48 having a high resistance value and a DC high voltage line 50. If a high DC voltage is applied to the DC electrode 44 from the DC power supply 45, the semiconductor wafer W can be attracted to and held on the electrostatic chuck 38 by a Coulomb force. The DC high voltage line 50 is a coated line and is connected to the DC electrode 44 of the electrostatic chuck 38 while penetrating the susceptor 12 from below after passing through the inside of the cylindrical power feed rod 34.

Figure 2:
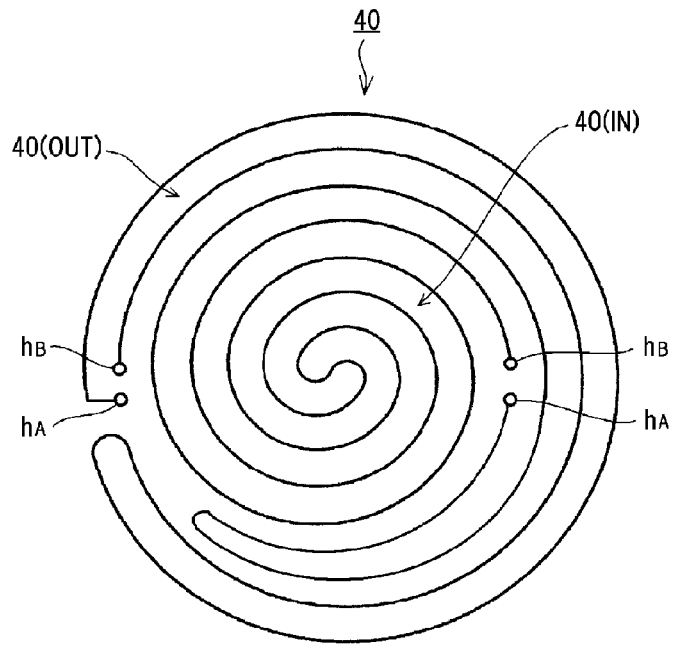
FIG. 2 is a substantially plane view illustrating a configuration of a heating element provided in a susceptor (lower electrode) of the plasma processing apparatus.

The heating element 40 is implemented by, for example, a resistance heating wire having a spiral shape, which is embedded in the dielectric member 42 of the electrostatic chuck 38 along with the DC electrode 44. In this exemplary embodiment, this heating element 40 is divided in two parts in a radial direction of the susceptor 12: an inner heating wire 40(IN) and an outer heating wire 40(OUT), as depicted in FIG. 2. Among these components, the inner heating wire 40(IN) is electrically connected to a dedicated heater power supply 58(IN) provided at the outside of the chamber 10 via power feed conductors 52(IN) covered with an insulating coating, a filter unit 54(IN) and electric cables 56(IN). The outer heating wire 40(OUT) is electrically connected to a dedicated heater power supply 58(OUT) provided at the outside of the chamber 10 via power feed conductors 52(OUT) covered with an insulating coating, a filter unit 54(OUT) and electric cables 56(OUT). Among these components, the filter units 54(IN) and 54(OUT) are primary features of the present exemplary embodiment, and an internal configuration and an operation of these filter units will be described in detail later.

An annular coolant room or coolant path 60 extended along, e.g., a circumferential direction is formed within the susceptor 12. A coolant of a preset temperature, e.g., cooling water cw from a chiller unit (not shown) is supplied into and circulated through the coolant path 60 via a coolant supply line. A temperature of the susceptor 12 can be reduced by adjusting the temperature of the coolant. Further, a heat transfer gas such as a He gas from a heat transfer gas supply unit (not shown) is supplied to an interface between the electrostatic chuck 38 and the semiconductor wafer W through a gas supply line and a gas passage 62 within the susceptor 12 in order to thermally connect the semiconductor wafer W to the susceptor 12.

A shower head 64 serving as an upper electrode is provided at a ceiling of the chamber 10, facing the susceptor 12 in parallel. The shower head 64 includes an electrode plate 66 directly facing the susceptor 12; and an electrode supporting body 68 configured to support the electrode plate 66 from a backside thereof (from above it) in a detachable manner. A gas room 70 is formed within the electrode supporting body 68, and a multiple number of gas discharge holes 72 extended from the gas room 70 toward the susceptor 12 are formed through the electrode supporting body 68 and the electrode plate 66. A space SP between the electrode plate 66 and the susceptor 12 serves as a plasma generation space or a processing space. A gas supply line 76 led from a processing gas supply unit 74 is connected to a gas inlet opening 70a formed at a top portion of the gas room 70. The electrode plate 66 may be made of, by way of non-limiting example, but not limitation, Si, SiC or C, and the electrode supporting body 68 may be made of, by way of example, but not limitation, alumite-treated aluminum.

Operations of individual components of the plasma etching apparatus, e.g., the exhaust device 24, the high frequency power supplies 28 and 30, the switch 46 of the DC power supply 45, the heater power supplies 58(IN) and 58(OUT), the chiller unit (not shown), the heat transfer gas supply unit (not shown), the processing gas supply unit 74, and so forth and the overall operation (sequence) of the plasma etching apparatus are controlled by a controller 75 having a microcomputer.

A basic single-substrate dry-etching operation in this plasma etching apparatus is performed as follows. First, the gate valve 26 is first opened, and the semiconductor wafer W to be processed is loaded into the chamber 10 and mounted on the electrostatic chuck 38. Then, an etching gas (generally, a mixture gas) is introduced into the chamber 10 from the processing gas supply unit 74 at a certain flow rate, and an internal pressure of the chamber 10 is controlled to a preset value by the exhaust device 24. Further, the first and second high frequency power supplies 28 and 30 are powered on, and the first and second high frequency power supplies 28 and 30 output the first high frequency power HF and the second high frequency power LF at required power levels, respectively, and apply the high frequency powers HF and LF to the susceptor (lower electrode) 12 via the matching unit 32 and the power feed rod 34. Further, the heat transfer gas (e.g., a He gas) is supplied to the interface between the electrostatic chuck 38 and the semiconductor wafer W from the heat transfer gas supply unit. Further, by turning on the switch 46 for the electrostatic chuck, the heat transfer gas is confined into the interface between the electrostatic chuck 38 and the semiconductor wafer W by an electrostatic attracting force. Meanwhile, by turning on the heater power supplies 58(IN) and 58(OUT), Joule heats are generated by the inner heating wire 40(IN) and the outer heating wire 40(OUT), respectively, so that the temperature or a temperature distribution of the top surface of the susceptor 12 can be controlled to a preset value. The etching gas discharged from the shower head 64 is excited into plasma by a high frequency discharge between the susceptor 12 and the shower head 64 (i.e., between the two facing electrodes). A processing target film on the surface of the semiconductor wafer W is etched to have a required pattern by radicals or ions in the plasma.

This plasma etching apparatus is of a cathode-coupled type, and by applying the first high frequency power HF having a relatively high frequency (desirably, equal to or higher than 27 MHz) suitable for plasma generation to the susceptor 12, plasma can be highly densified in a desirably dissociated state. Accordingly, high-density plasma can be generated under a lower pressure condition. Further, by applying the second high frequency power LF having a relatively lower frequency (equal to or lower than 13 MHz) suitable for ion attraction to the susceptor 12, an anisotropic etching process having high selectivity can be performed on the semiconductor wafer W mounted on the susceptor 12.

Especially, in this exemplary embodiment, as will be described later, the first high frequency power HF and the second high frequency power LF have a high frequency range (typically, 40 MHz or higher) suitable for generating high-density plasma and a low frequency range (typically, 3.2 MHz or lower) suitable for controlling ion energy, respectively.

Moreover, in this capacitively coupled plasma etching apparatus, the susceptor 12 is cooled by the chiller unit and heated by the heater, and the heating by the heater is controlled independently at the central region and the peripheral region of the susceptor 12 in the radial direction thereof. Thus, the temperature can be changed and increased or decreased rapidly at a high speed, and profile of the temperature distribution can be controlled as required or in various ways.

Further, in this capacitively coupled plasma etching apparatus, during a plasma etching process, a part of the first high frequency power HF and a part of the second high frequency power LF applied to the susceptor 12 from the high frequency power supplies 28 and 30, respectively, may be introduced as high frequency noises into the power feed conductors 52(IN) and 52(OUT) through the inner heating wire 40(IN) and the outer heating wire 40(OUT) embedded in the susceptor 12, respectively. If any of these high frequency noises of the two different frequencies reaches the heater power supplies 58(IN) and 58(OUT), operation and performance of the heater power supplies 58(IN) and 58(OUT) may be degraded.

In this regard, as described above, the filter units 54(IN) and 54(OUT) are provided on heater power feed lines which electrically connect the heater power supplies 58(IN) and 58(OUT) and the inner heating wire 40(IN) and the outer heating wire 40(OUT), respectively. These filter units 54(IN) and 54(OUT) are configured to stably and securely perform a filter blocking function with sufficiently high impedance against any of the noises of the first and second high frequency powers HF and LF, which are introduced into the heater power feed lines from the inner and outer heating wires 40(IN) and 40(OUT), at low power consumption efficiently, as will be described in detail later. Accordingly, in this plasma etching apparatus of the exemplary embodiment, a wafer temperature control function using a heater is improved, and a leakage of the first and second high frequency powers HF and LF from the chamber 10 into the heater power feed lines through the heating element 40 within the susceptor 12 can be effectively suppressed or reduced. Thus, reproducibility and reliability of the plasma process can be improved.

<Circuit Configuration within Filter Unit>

Now, a circuit configuration within the filter units 54(IN) and 54(OUT), which is a major feature in this plasma processing apparatus, will be explained. Since the filter units 54(IN) and 54(OUT) have the same configuration and operation, only one filter unit 54(IN) will be explained.

Figure 3:
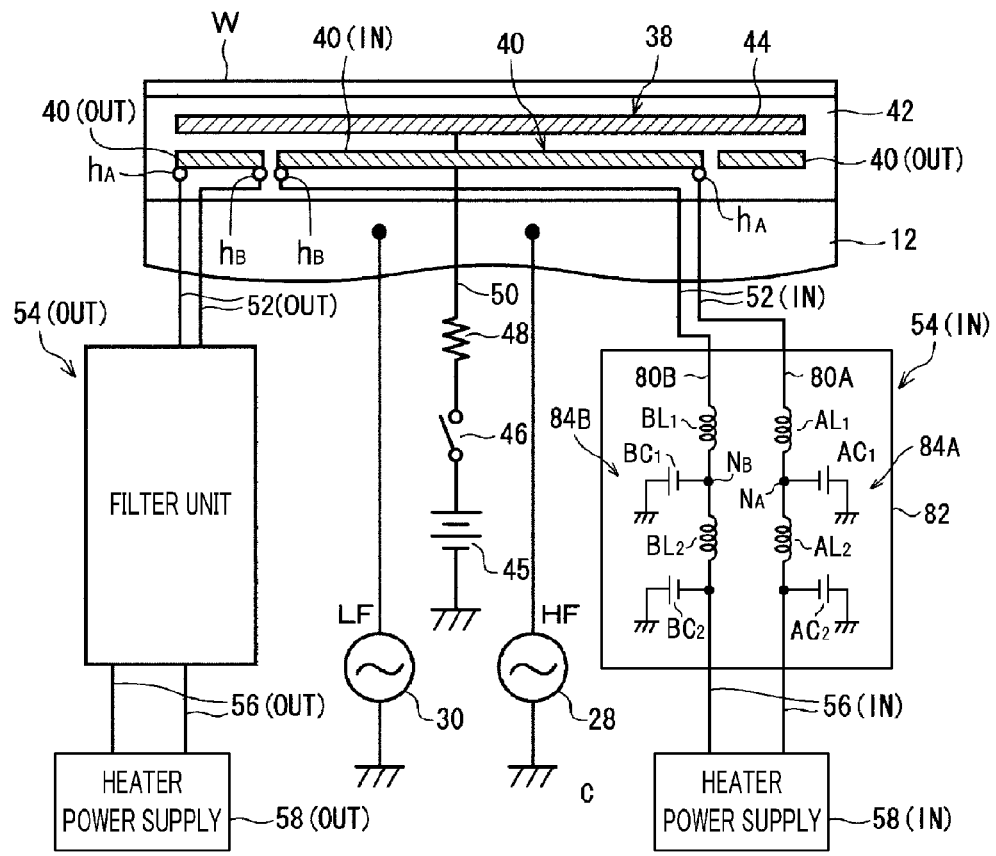
FIG. 3 is a diagram illustrating a circuit configuration of a heater power supply unit configured to apply a power to the heating element within the susceptor.

FIG. 3 illustrates circuit configurations of heater power supply unit configured to apply a power to the heating element 40 which is provided in the susceptor 12 to control the temperature of the wafer. In this exemplary embodiment, the heater power supply units having the substantially same circuit configuration are connected to the inner heating wire 40(IN) and the outer heating wire 40(OUT) of the heating element 40, respectively. With this configuration, heating amounts or heating temperatures of the inner heating wire 40(IN) and the outer heating wire 40(OUT) can be controlled individually. In the following description, a configuration and an operation of the heater power supply unit for the inner heating wire 40(IN) will be elaborated. The heater power supply unit for the outer heating wire 40(OUT) has the completely same configuration and operation.

The heater power supply 58(IN) is an AC output power supply that performs a switching (ON/OFF) operation for a commercial frequency by using, e.g., SSR (Solid State Relay). The heater power supply 58(IN) is connected with the inner heating wire 40(IN) in a closed-loop circuit. To elaborate, a first output terminal of a pair of output terminals of the heater power supply 58(IN) is electrically connected to a first terminal $h_A$ of the inner heating wire 40(IN) via a first power feed line (power cable) 80A and a second output terminal thereof is electrically connected to a second terminal $h_B$ of the inner heating wire 40(IN) via a second power feed line (power cable) 80B.

The filter unit 54(IN) includes a first filter 84A and a second filter 84B configured to block high frequency noises introduced into the first and second power feed lines 80A and 80B, respectively, in a housing 82. Here, the housing 82 is made of a cylindrical conductor and grounded. The filters 84A and 84B have substantially the same circuit configuration, and characteristic values of corresponding reactance elements between the two filters are also substantially same.

More specifically, in the filter 84A (84B), a first-stage coil $AL_1$ ($BL_1$) and a next-stage coil $AL_2$ ($BL_2$) are connected in series on the power feed line 80A (80B) in this sequence when viewed from the side of the heating element 40. Further, a first capacitor $AC_1$ ($BC_1$) is electrically connected between the housing 82 and a connection point $N_A$ ($N_B$)

between the first-stage coil $AL_1$ ($BL_1$) and the next-stage coil $AL_2$ ($BL_2$). Moreover, a second capacitor $AC_2$ ($BC_2$) is electrically connected between a terminal of the next-stage coil $AL_2$ ($BL_2$) at the side of the heater power supply 58(IN) and the housing 82.

In the heater power supply unit having the above-described configuration, during a positive cycle, an electric current outputted from the heater power supply 58(IN) may flow from a first terminal $h_A$ to the inner heating wire 40(IN) through the first power feed line 80A, i.e., through the electric cable 56(IN), the next-stage coil $AL_2$, the first-stage coil $AL_1$, and the power feed conductor 52(IN), so that each part of the inner heating wire 40(IN) generates Joule heat. Then, after flowing from a second terminal $h_B$, the electric current is returned back through the second power feed line 80(B), i.e., through the power feed conductor 52(IN), the first-stage coil $BL_1$, the next-stage coil $BL_2$ and the electric cable 56(IN). During a negative cycle, the electric current flows through the same circuit in the reverse direction to that stated above. Since the electric current of this AC output from the heater is typically in a range from 50 Hz to several hundreds of hertz (Hz), voltage drops of the coils $AL_1$, $BL_1$, $AL_2$ and $BL_2$ may be negligibly small, and the amount of a leakage current flowing to the earth through the capacitors $AC_1$, $BC_1$, $AC_2$ and $BC_2$ may also be negligibly small. In this exemplary embodiment, as will be described later, the first-stage coils $AL_1$ and $BL_1$ are implemented by cylindrical air-core solenoid coils, i.e., air-core solenoid coils, and the next-stage coils $AL_2$ and $BL_2$ are implemented by troidal coils.

<Physical Configuration within Filter Unit>

Figure 4:
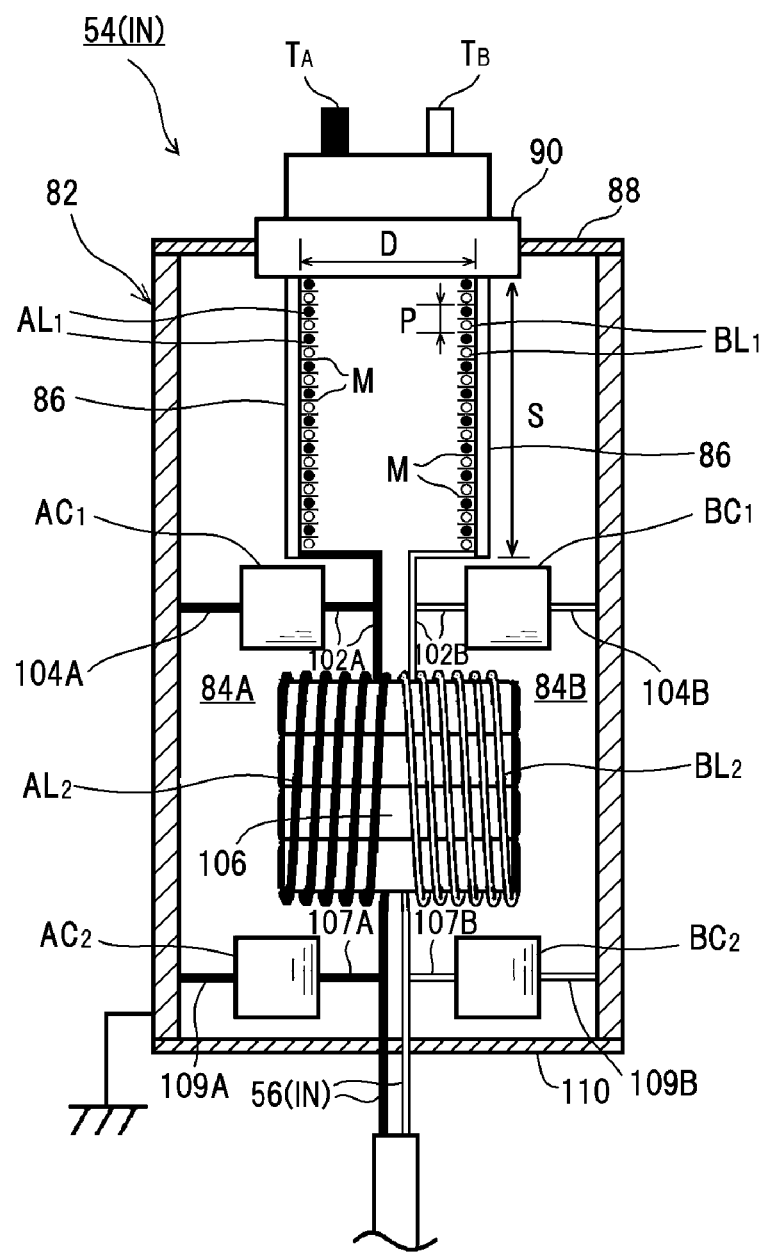
FIG. 4 is a longitudinal cross sectional view illustrating an overall structure of a filter unit according to the first exemplary embodiment.

FIG. 4 illustrates a physical structure within the filter unit 54(IN) according to the present exemplary embodiment. FIG. 5A to FIG. 9 illustrate a configuration of major parts within the filter unit 54(IN).

As depicted in FIG. 4, the filter unit 54(IN) includes the housing 82 or a grounded cylindrical conductor made of, but not limited to, aluminum, and the air-core solenoid coils $AL_1$ and $BL_1$, the first capacitors $AC_1$ and $BC_1$, the troidal coils $AL_2$ and $BL_2$, and the second capacitors $AC_2$ and $BC_2$ are arranged in this sequence from top to bottom therein.

Each of the air-core solenoid coils $AL_1$ and $BL_1$ has a thicker coil conductor and a larger coil size than those of a general solenoid coil. With this configuration, each of the air-core solenoid $AL_1$ and $BL_1$ may serve as a power feed line through which a sufficiently large electric current (e.g., about 30 A) flows into the inner heating wire 40(IN) from the heater power supply 58(IN), and further, may obtain very large inductance and a large line length with the air core without having a magnetic core such as ferrite for the purpose of suppressing heat generation (power loss).

In this exemplary embodiment, however, since the frequency of the high frequency noise to be blocked by the air-core solenoid coils $AL_1$ and $BL_1$ is set to be in a high frequency range (40 MHz or higher), the size of the air-core solenoid coils $AL_1$ and $BL_1$ does not need to be so large. For example, the air-core solenoid coils $AL_1$ and $BL_2$ may have a diameter D of 25 mm or less and a length S of 150 mm or less.

Within the housing 82, the two air-core solenoid coils $AL_1$ and $BL_1$ are provided coaxially with respect to the housing 82 by being supported by a coil supporting shaft (not shown) which is made of an insulator, e.g., a resin. The coil conductor of each of the air-core solenoid coils $AL_1$ and $BL_1$ is spirally wound at a variable winding pitch p in multiple stages in a substantially bare wire state without being covered with a coil sleeve, and has the same coil length S.

In the vicinity of the air-core solenoid coils $AL_1$ and $BL_1$, a multiple number of, e.g., four rod-shaped comb-teeth members 86, which are extended in parallel to a coil axis direction, are provided adjacent to the outer periphery of the air-core solenoid coils $AL_1$ and $BL_1$ at a regular interval in a circumferential direction thereof. Each comb-teeth member 86 is made of a resin having high hardness, processibility and heat resistance, such as, but not limited to, an insulator, e.g., PEEK or PCTFE, and is fixed in the filter unit 54(IN) independently from the air-core solenoid coils $AL_1$ and $BL_1$.

Figure 5A:
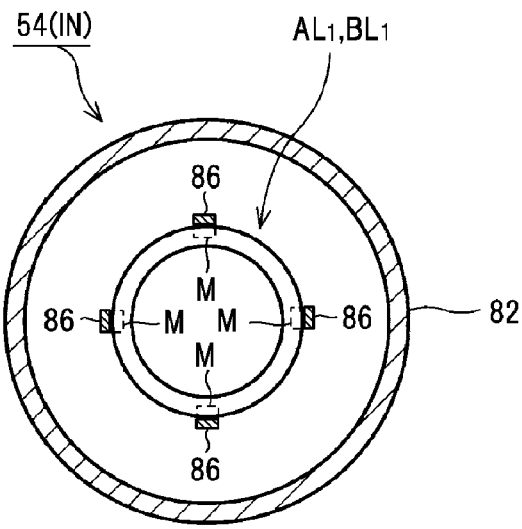
FIG. 5A is a horizontal cross sectional view illustrating a configuration of major parts of the filter unit.
Figure 5B:
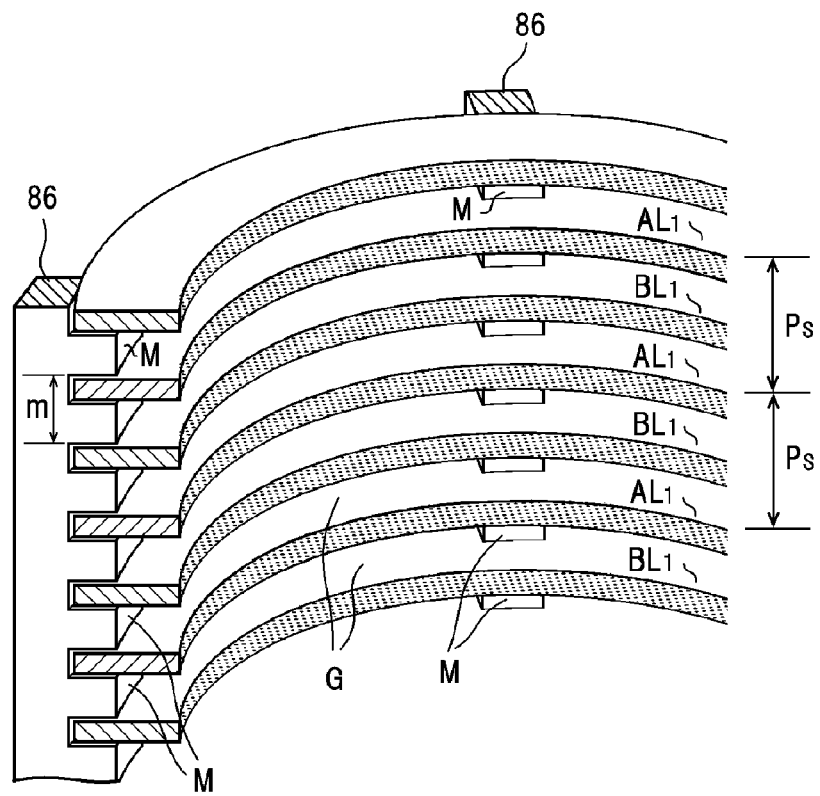
FIG. 5B is a partially enlarged perspective view illustrating a configuration of major parts of the filter unit.

As depicted in FIG. 5A and FIG. 5B, comb teeth M are formed on an inner surface of each comb-teeth member 86, and the comb teeth M are inserted (fitted) into respective winding gaps of the air-core solenoid coils $AL_1$ and $BL_1$. From another viewpoint, the coil conductor of each of the air-core solenoid coils $AL_1$ and $BL_1$ is inserted into each of slits between every two adjacent comb teeth M. Accordingly, a winding pitch p of each of the air-core solenoid coils $AL_1$ and $BL_1$ is determined according to a pitch m of the comb teeth M. In this exemplary embodiment, since the two the air-core solenoid coils $AL_1$ and $BL_1$ are spirally wound while being overlapped, the winding pitch p of each of the air-core solenoid coils $AL_1$ and $BL_1$ is twice the pitch m of the comb teeth M. That is, a relationship of p=2m is established. In this exemplary embodiment, the winding pitch p of each of the two air-core solenoid coils $AL_1$ and $BL_1$ is constant ($P_5$) from one end of the coil to the other end thereof.

An annular cover body 88 and an upper connector 90 made of a resin are provided at an upper opening of the housing 82. Upper ends of the aforementioned non-illustrated coil supporting shaft and the comb-teeth members 86 are coupled to the upper connector 90. Further, upper ends of the air-core solenoid coils $AL_1$ and $BL_1$ are electrically connected to the filter terminals TA and TB, respectively, within or in the vicinity of the upper connector 90.

Figure 6A:
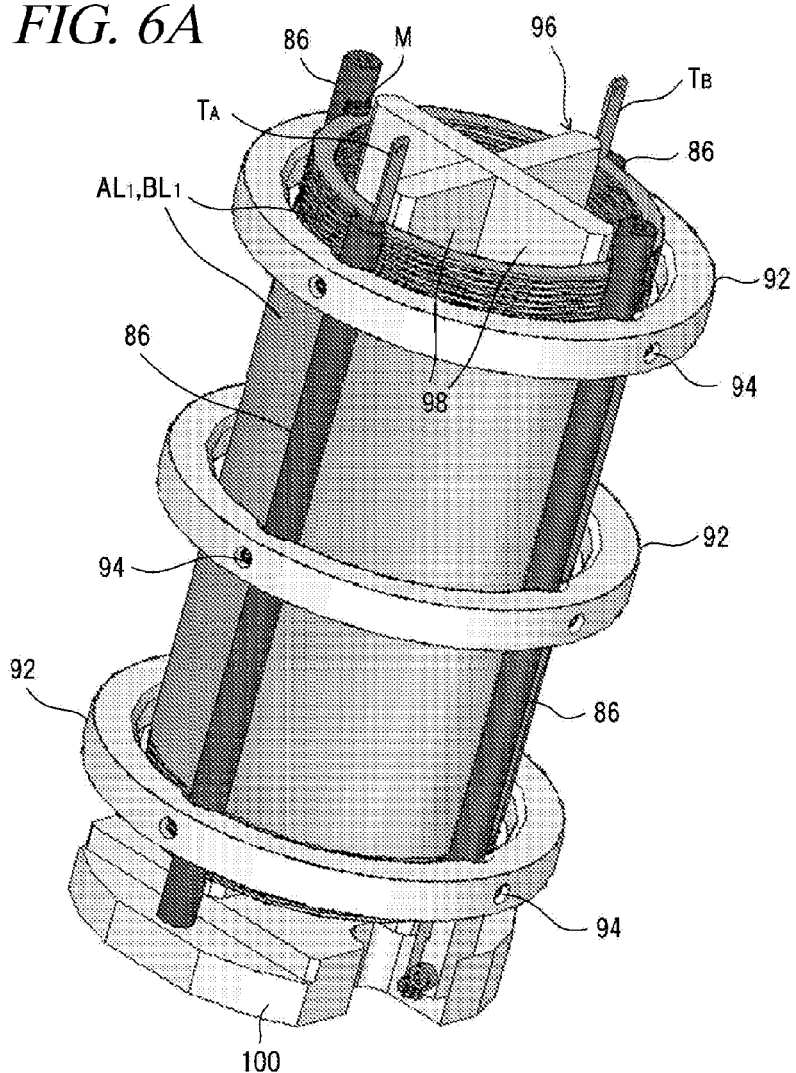
FIG. 6A is a perspective view illustrating a specific configuration example of a sub-assembly around an air-core solenoid coil in the filter unit.
Figure 6B:
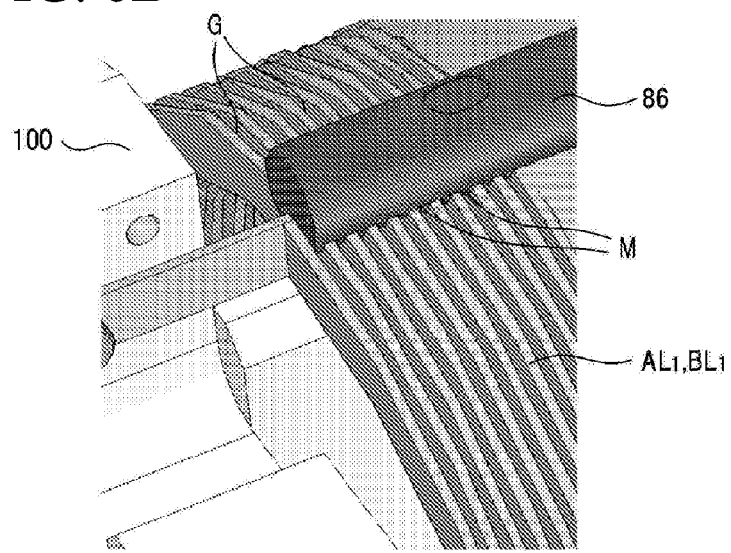
FIG. 6B is a partially enlarged perspective view illustrating major parts of the sub-assembly.

FIG. 6A and FIG. 6B depict a configuration of a sub-assembly the vicinity of the air-core solenoid coils $AL_1$ and $BL_1$ in the present exemplary embodiment. As illustrated, the multiple (four) rod-shaped comb-teeth members 86 are coupled by bolts 94 to a ring-shaped supporting body 92, which is made of, for example, a resin and surrounds the comb-teeth members 86 at multiple positions (three positions at both end portions and at an intermediate portion) in an axial direction. The comb teeth M formed on the inner surface of each comb-teeth member 86 are inserted (fitted) into the winding gaps of the air-core solenoid coils $AL_1$ and $BL_1$. Accordingly, the winding pitch p of the air-core solenoid coils $AL_1$ and $BL_1$ corresponds to the pitch m of the comb teeth M in a relationship of p=2m, and air gaps G corresponding to the thickness of the comb teeth M are formed in winding gaps of the coils except where the comb teeth M are inserted (FIG. 6B, FIG. 5B).

A coil supporting shaft 96 having, for example, a cross-shaped cross section is inserted into the air-core solenoid coils $AL_1$ and $BL_1$. This coil supporting shaft 96 is formed of a multiple number of plate-shaped members 98 which are made of an insulator, e.g., a resin and are radially extended in a coil radial direction to come into contact with inner peripheral surfaces of the air-core solenoid coils $AL_1$ and $BL_1$ and, also, extended in parallel to the air-core solenoid coils $AL_1$ and $BL_1$ in the coil axis direction. Further, in FIG. 6A and FIG. 6B, a block 100 that holds the coil supporting shaft 96, the comb-teeth members 86, and so froth at one end side of the air-core solenoid coils $AL_1$ and $BL_1$ is a jig configured to assemble this sub-assembly.

Figure 7:
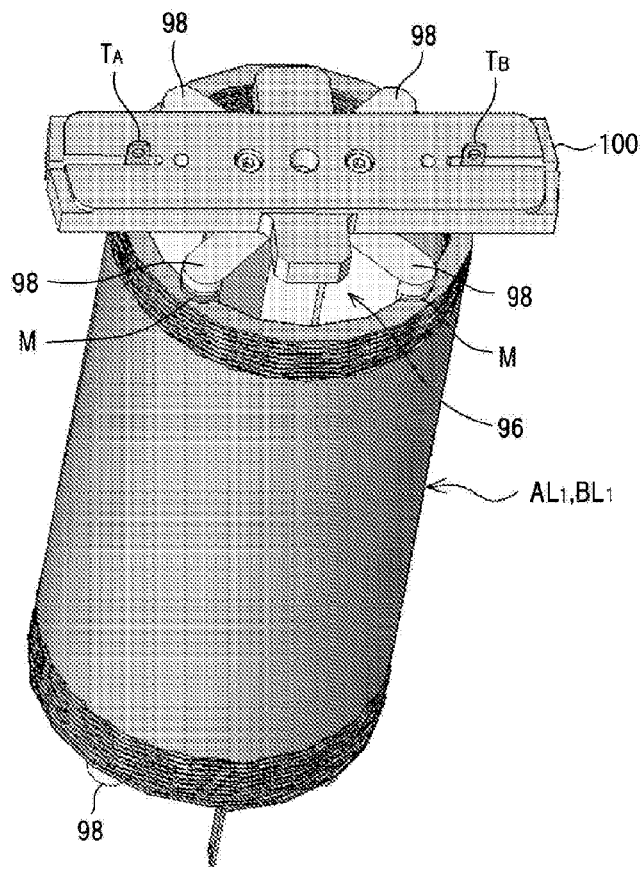
FIG. 7 is a perspective view illustrating a modification example of the specific configuration of the sub-assembly.

FIG. 7 illustrates a structure of a sub-assembly in the vicinity of the air-core solenoid coils $AL_1$ and $BL_1$ according to a modification example. In this modification example, comb teeth M are formed at outer end surfaces of the plate-shaped members 98 forming the coil supporting shaft 96. The comb teeth M of the plate-shaped members 98 are inserted (fitted) into the winding gaps of the air-core solenoid coils $AL_1$ and $BL_1$ from the inside thereof in the coil radial direction, and define the winding pitch p with a relationship of p=2m. In this structure, since the plate-shaped members 98 forming the coil supporting shaft 96 also serve as the comb-teeth members, the aforementioned rod-shaped comb-teeth members 86 need not be provided in the vicinity of the air-core solenoid coils $AL_1$ and $BL_1$.

As another modification example, the comb teeth M are formed with a preset pitch m at the outer end surfaces of the plate-shaped members 98 provided within the air-core solenoid coils $AL_1$ and $BL_1$ as shown in FIG. 7, and the rod-shaped comb-teeth members 86 having, on the inner surfaces thereof, the comb teeth M formed with the same pitch m as shown in FIG. 6A are arranged in the vicinity of the air-core solenoid coils $AL_1$ and $BL_1$. That is, it is possible to adopt a configuration in which the comb teeth M are inserted (fitted) into the winding gaps of the air-core solenoid coils $AL_1$ and $BL_1$ at different positions in the circumferential direction from both the inner side and the outer side in the coil radial direction. Furthermore, as still another modification example, it may be also possible to adopt a configuration in which a multiple number of rod-shaped comb-teeth members 86 are provided within the air-core solenoid coils $AL_1$ and $BL_1$, and the comb teeth M formed at the outer surfaces of the respective comb-teeth members 86 are inserted into the winding gaps of the coils $AL_1$ and $BL_1$.

Referring back to FIG. 4, the first capacitors $AC_1$ and $BC_1$ are implemented by two-terminal capacitors available on the market, respectively, and are horizontally arranged in a pair within a space between the air-core solenoid coils $AL_1$ and $BL_1$ and the troidal coils $AL_2$ and $BL_2$. One terminal of the first capacitor $AC_1$ of the first filter 84A is connected to a lower terminal of the air-core solenoid coil $AL_1$ via a connection conductor 102A, and the other terminal of this first capacitor $AC_1$ is connected to a sidewall of the housing 82 via a connection conductor 104A. One terminal of the first capacitor $BC_1$ of the second filter 84B is connected to a lower terminal of the air-core solenoid coil $BL_1$ via a connection conductor 102B, and the other terminal of this first capacitor $BC_1$ is connected to the sidewall of the housing 82 via a connection conductor 104B.

Figure 8:
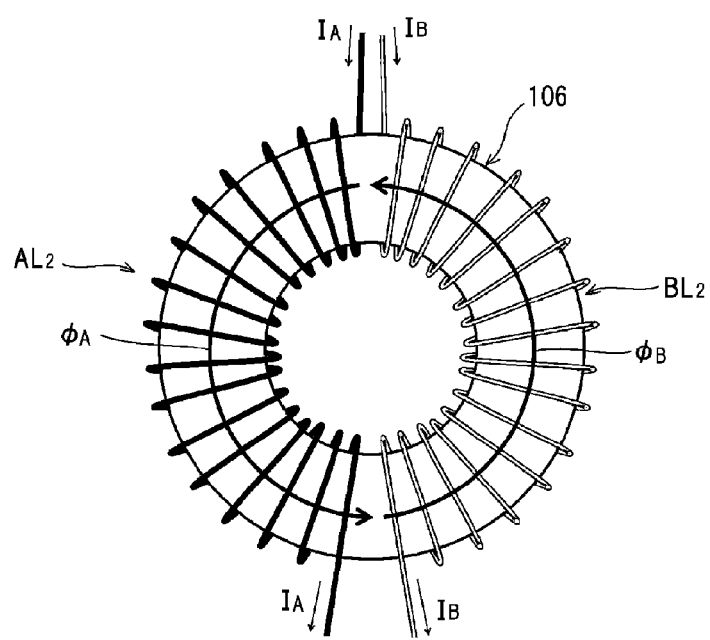
FIG. 8 is a plane view illustrating a structure of a troidal coil provided within the filter unit.

Desirably, a coil conductor of each of the troidal coils $AL_2$ and $BL_2$ is spirally wounded halfway around a common troidal core 106 which is provided coaxially with respect to the air-core solenoid coils $AL_1$ and $BL_1$, as illustrated in FIG. 4 and FIG. 8. Here, the coil conductors of the two troidal coils $AL_2$ and $BL_2$ are wounded in the reverse directions so that magnetic fluxes $\phi_A$ and $\phi_B$ generated within the troidal core 106 when high frequency electric currents $I_A$ and $I_B$ of the same phase are flown into the two troidal coils $AL_2$ and $BL_2$, respectively, have the same direction (are overlapped in the same direction) in the circumference direction thereof. The troidal core 106 is made of a core material having high relative permeability, such as Ni—Zn-based ferrite, and forms an annular closed magnetic path.

One terminal (upper terminal) of the troidal coil $AL_2$ of the first filter 84A is connected to the lower terminal of the air-core solenoid coil $AL_1$ via the connection conductor 102A, and the other terminal (lower terminal) of the troidal coil $AL_2$ is connected to one terminal of the second capacitor $AC_2$ via a connection conductor 107A. One terminal (upper terminal) of the troidal coil $BL_2$ of the second filter 84B is connected to the lower terminal of the air-core solenoid coil $BL_1$ via the connection conductor 102B, and the other terminal (lower terminal) of the troidal coil $BL_2$ is connected to one terminal of the second capacitor $BC_2$ via a connection conductor 107B.

Figure 9:
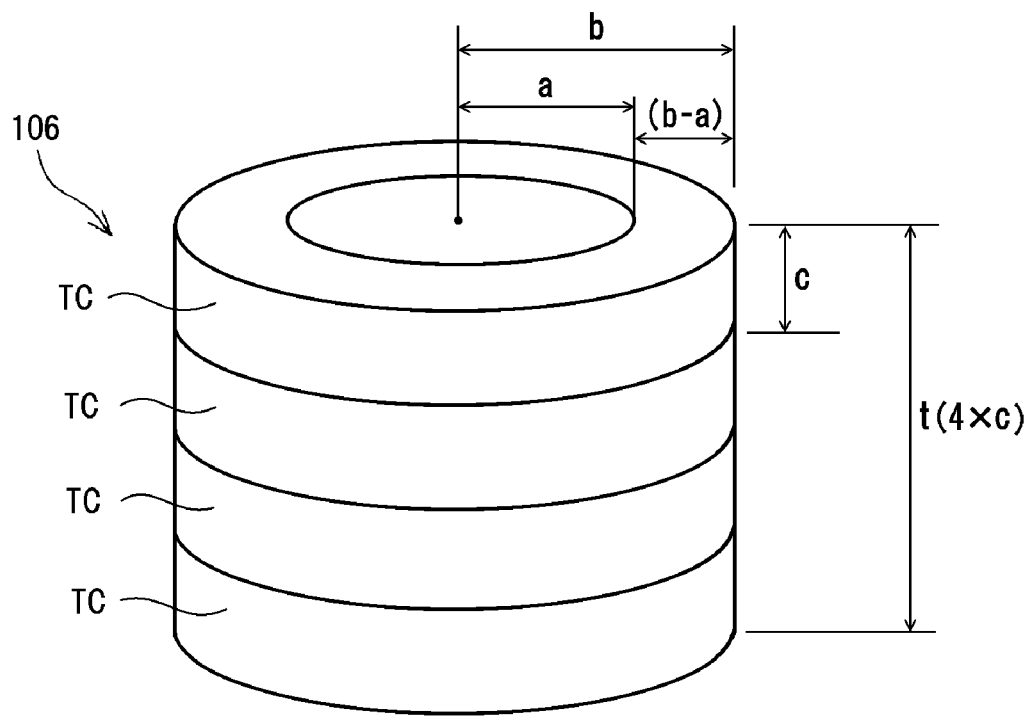
FIG. 9 is a perspective view illustrating an exterior configuration of a troidal core in the troidal coil.

In the present exemplary embodiment, to increase stray capacitance per a single turn of the coil winding between the troidal coils $AL_2$ and $BL_2$ and the housing 82, a thickness t of the troidal core 106 is set to be at least twice (desirably, four or more times) as large as a typical thickness thereof. For this reason, multiple single-body troidal cores TC, which are available on the market, are stacked on top of each other in an axial direction (vertical direction) in plural levels (e.g., four levels), as illustrated in FIG. 9.

Assume that each single-body troidal core TC has an inner radius a, an outer radius b and a thickness (height) c. Generally, a horizontal width (b−a) of a body portion of the core and the thickness c are substantially same, and there is established a relationship of c≈(b−a). Accordingly, if two troidal cores TC are stacked in two levels, the thickness (height) t of the troidal core 106 is t=2c, and there is established a relationship of t≈2(b−a). Further, if four troidal cores TC are stacked in four levels, as in the illustrated configuration example, the thickness (height) t of the troidal core 106 is t=4c, and a relationship of t≈4(b−a) is established. In this exemplary embodiment, to establish a relationship of t≥2(b−a), desirably, a relationship of t≥4(b−a), the thickness t of the troidal core 106 is set to be much larger than a thickness of a typical troidal.

Further, the typical troidal core always serves as a lumped constant element in a high frequency range. In this exemplary embodiment, the troidal coils $AL_2$ and $BL_2$ also serve as lumped constant elements in the high frequency range, particularly, for the basic frequencies of the first and second high frequency powers HF and LF.

Further, if a core is inserted in a coil, a loss of a high frequency power, i.e., a core loss occurs in a core material. Such a core loss of the core material, particularly, a hysteresis loss or an eddy current loss increases as a frequency increases. In the filter unit 54(IN) of the present exemplary embodiment, the noise of the first high frequency power HF having the high frequency is blocked by the first-stage air-core solenoid coils $AL_1$ and $BL_1$, and does not reach the next-stage troidal coils $AL_2$ and $BL_2$. Accordingly, a core loss of the troidal core 106 is small. As such, since the loss caused by the troidal core 106 is small, the troidal coils $AL_2$ and $BL_2$ can be scaled down by using a core material (e.g., ferrite) having high relative permeability as the troidal core 106.

Each of the second capacitors $AC_2$ and $BC_2$ is also implemented by a two-terminal capacitor available on the market. As depicted in FIG. 4, the second capacitors $AC_2$ and $BC_2$ are horizontally arranged in a pair within a space between the troidal coils $AL_2$ and $BL_2$ and a bottom plate 110 of the housing 82. One terminal of the second capacitor $AC_2$ of the first filter 84A is connected to the lower terminal of the troidal coil $AL_2$ and one of the electric cables 56(IN) via a connection conductor 107A, and the other terminal of the second capacitor $AC_2$ is connected to a sidewall of the housing 82 via a connection conductor 109A. One terminal of the second capacitor $BC_2$ of the second filter 84B is connected to a lower terminal of the troidal coil $BL_2$ and the other of the electric cables 56(IN) via a connection conductor 107B, and the other terminal of this second capacitor BC$_2$ is connected to the sidewall of the housing 82 via a connection conductor 109B.

A lower end opening of the housing 82 is closed by the bottom plate 110 made of, but not limited to, a resin. Further, either one or both of the cover body 88 and the bottom plate 110 of the housing 82 may be made of a conductive plate.

Further, a multiple number of vent holes (not shown) for air-cooling the air-core solenoid coils AL$_1$ and BL$_1$ and the troidal coils AL$_2$ and BL$_2$ accommodated in the housing 82 are formed at the housing 82 by, for example, a punching process.

As stated above, the filter unit 54(IN) includes, in the housing 82 which is made of the cylindrical conductor and is grounded, the air-core solenoid coils AL$_1$ and BL$_1$ arranged at the uppermost portion thereof, i.e., at the first stage, coaxially with respect to the housing 82; the troidal coils AL$_2$ and BL$_2$ arranged via the first capacitors AC$_1$ and BC$_1$ at the next stage coaxially with respect to the housing 82; and the second capacitors AC$_2$ and BC$_2$ arranged at the lowermost portion thereof.

In the above-described layout within the filter unit 54(IN), the air-core solenoid coils AL$_1$ and BL$_1$ are spirally wound at a uniform winding pitch interval while being overlapped in the axial direction (vertical direction). Further, the coil length S of the air-core solenoid coils AL$_1$ and BL$_1$ is not very large, and the air-core solenoid coils AL$_1$ and BL$_1$ is configured as a comparatively compact assembly. Meanwhile, the troidal coils AL$_2$ and BL$_2$ are wound halfway around the common troidal core 106, respectively, and they form a compact dual-coil assembly. Further, although the troidal coils AL$_2$ and BL$_2$ have the height (thickness) twice as large as the typical troidal coil, as mentioned above, their height dimension is smaller than that in a case where a rod-shaped solenoid coil having the same inductance is disposed vertically.

Further, since the troidal core 106 of the troidal coils AL$_2$ and BL$_2$ forms the annular closed magnetic path and is coaxially placed with respect to the air-core solenoid coils AL$_1$ and BL$_1$ which are located above the troidal core 106 (accordingly, magnetic fluxes of the air-core solenoid coils AL$_1$ and BL$_1$ and the troidal coils AL$_2$ and BL$_2$ are orthogonally intersected with each other), electrical interference between the air-core solenoid coils AL$_1$ and BL$_1$ and the troidal coils AL$_2$ and BL$_2$ can be avoided. Thus, a distance or a space between the two kinds of coils AL$_1$, BL$_1$ and AL$_2$, BL$_2$ in the axial or vertical direction can be reduced.

In the filter unit 54(IN), as will be described later, the air-core solenoid coils AL$_1$ and BL$_1$ are configured to perform the function of blocking the noise of the first high frequency power HF having the higher frequency. Meanwhile, the troidal coils AL$_2$ and BL$_2$ are configured to perform the function of blocking the noise of the second high frequency power LF having the lower frequency. That is, by allowing the air-core solenoid coils AL$_1$ and BL$_1$ and the troidal coils AL$_2$ and BL$_2$ to perform the individual filter functions of blocking the noise of the first high frequency power HF and the noise of the second high frequency power LF, respectively, design, manufacture and control of the entire filter unit 54(IN) are eased, and an apparatus difference may hardly occur. Further, since the filter unit 54(IN) can be sized down, the design layout of various kinds of power supply systems provided under the susceptor 12 or the chamber 10 can also be eased.

Furthermore, in the filter unit 54(IN), a layout in which the air-core solenoid coils AL$_1$ and BL$_1$ and the troidal coils AL$_2$ and BL$_2$ are exchanged, i.e., a layout in which the troidal coils AL$_2$ and BL$_2$ are arranged at the uppermost portion and the air-core solenoid coils AL$_1$ and BL$_1$ are arranged at the next stage is not desirable. That is, if the troidal coils AL$_2$ and BL$_2$ are arranged at the uppermost portion, the troidal coils AL$_2$ and BL$_2$ just allow, among the noises of the first and second high frequency powers HF and LF introduced into the high frequency power feed lines 80A and 80B from the heating element 40(IN), the noise of the first high frequency power HF having the higher frequency to pass therethrough, though they block the noise of the second high frequency power LF having the lower frequency. Further, since the capacitance of the first capacitors AC$_1$ and BC$_1$ is set to have a very small value as will be described later, not only the noise of the second high frequency power LF but also the noise of the first high frequency power HF are not flown to the earth. Accordingly, the noise of the first high frequency power HF is introduced into the troidal coils AL$_2$ and BL$_2$, and the electric current of the first high frequency power HF flows in the troidal coils AL$_2$ and BL$_2$. As a result, a great amount of core loss may occur within the troidal core 106, so that the troidal core 106 generates heat and reaches a high temperature. If the temperature of the troidal core 106 increases up to the Curie temperature or higher, magnetic permeability may decline sharply, so that the blocking function against the noise of the second high frequency power LF may not be performed.

On the other hand, in the layout where the air-core solenoid coils AL$_1$ and BL$_1$ are arranged at the uppermost portion and the troidal coils AL$_2$ and BL$_2$ are arranged at the next stage, as in the present exemplary embodiment, since the air-core solenoid coils AL$_1$ and BL$_1$ block the noise of the first high frequency power HF having the higher frequency, noise of the first high frequency power HF hardly reaches the troidal coils AL$_2$ and BL$_2$. Accordingly, the electric current of the first high frequency power HF having the higher frequency hardly flows in the troidal coils AL$_2$ and BL$_2$, so that the troidal core 106 neither generates heat nor reaches a high temperature.

<Operation of Filter Unit>

In the filter unit 54(IN) in accordance with the present exemplary embodiment, a distributed constant line is formed between the air-core solenoid coil AL$_1$ (BL$_1$) of the filter 84A (84B) and the housing 82 as the outer conductor.

In general, characteristic impedance Z$_o$ of a transmission line is expressed as $Z_o=\sqrt{(L/C)}$ by using electrostatic capacitance C per a unit length and inductance L per a unit length when no loss is assumed. Further, a wavelength λ is calculated by the following equation (1).

$$\lambda=2\pi/(\omega\sqrt{(LC)}) \qquad (1)$$

Unlike in a general distributed constant line (especially, in a coaxial line) where a rod-shaped cylindrical conductor serves as the central portion of the transmission line, the cylindrical air-core solenoid coils serve as a central conductor in the filter unit 54(IN). It is assumed that the inductance L per a unit length is mainly caused by the cylindrical coil. Meanwhile, the electrostatic capacitance per a unit length is defined as electrostatic capacitance C of a capacitor formed by a coil surface and the outer conductor. In this filter unit 54(IN), when the inductance per a unit length and the electrostatic capacitance per a unit length are L and C, respectively, it is assumed that a distributed constant line of which characteristic impedance Z$_o$ is expressed as $Z_o=\sqrt{(L/C)}$ is formed.

When the filter unit having this distributed constant line is viewed from the side of the terminal T, since an opposite side thereof is nearly short-circuited by the capacitor having large capacitance (e.g., about 5000 pF), there may be obtained a frequency-impedance characteristic in which large impedance is repeated at a constant frequency interval. This impedance characteristic may be obtained when the wavelength and the length of the distributed line are same.

Figure 10:
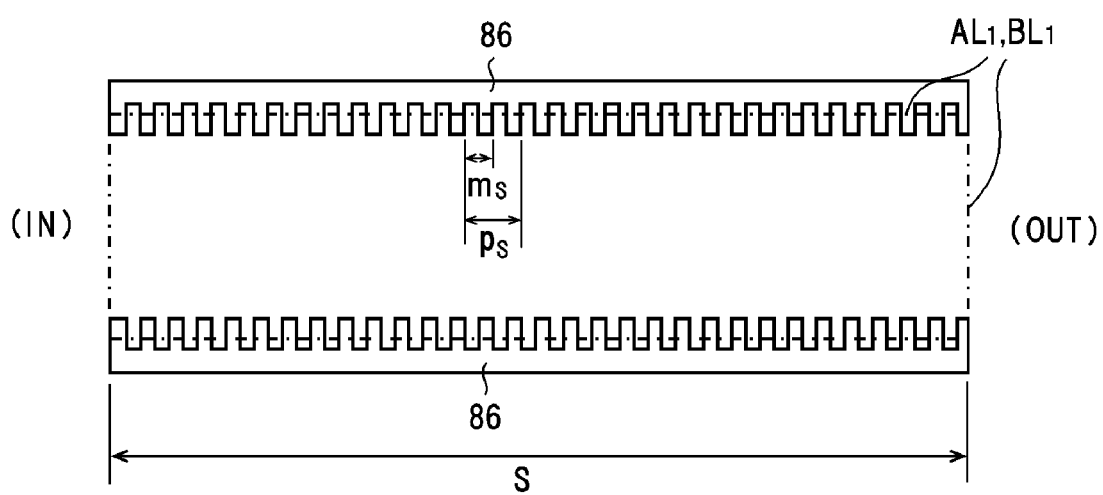
FIG. 10 is a diagram schematically illustrating a standard winding pitch distribution of the air-core solenoid coil in the filter unit.

In this filter unit 54(IN), not a winding length of the air-core solenoid coils $AL_1$ and $BL_1$ but a coil length S in the axial direction (FIG. 4) becomes the length of the distributed line. By using the air-core solenoid coils $AL_1$ and $BL_1$ as the central conductor, L can be increased to be much larger than that in case of using a rod-shaped cylindrical conductor as the central conductor, so that λ can be reduced. Thus, it is possible to realize an effective length that is a comparatively short line length (coil length S) and is equal to or larger than the wavelength. Therefore, in the first-stage filter circuit composed of the first capacitor $AC_1$ ($BC_1$) and the air-core solenoid coil $AL_1$ ($BL_1$) having the constant winding pitch $p_s$ as shown in FIG. 10, it is possible to obtain a frequency-impedance characteristic in which high impedances are repeated at a regular frequency interval as illustrated in FIG. 11, for example.

In the present exemplary embodiment, the air-core solenoid coil $AL_1$ ($BL_1$) only needs to block a high frequency noise in a high frequency range (equal to or higher than 40 MHz). It may be allowable that the air-core solenoid coil $AL_1$ ($BL_1$) has low impedance against a high frequency noise in a low frequency range (equal to or lower than 3.2 MHz) by being reduced in its coil size.

Figure 11:
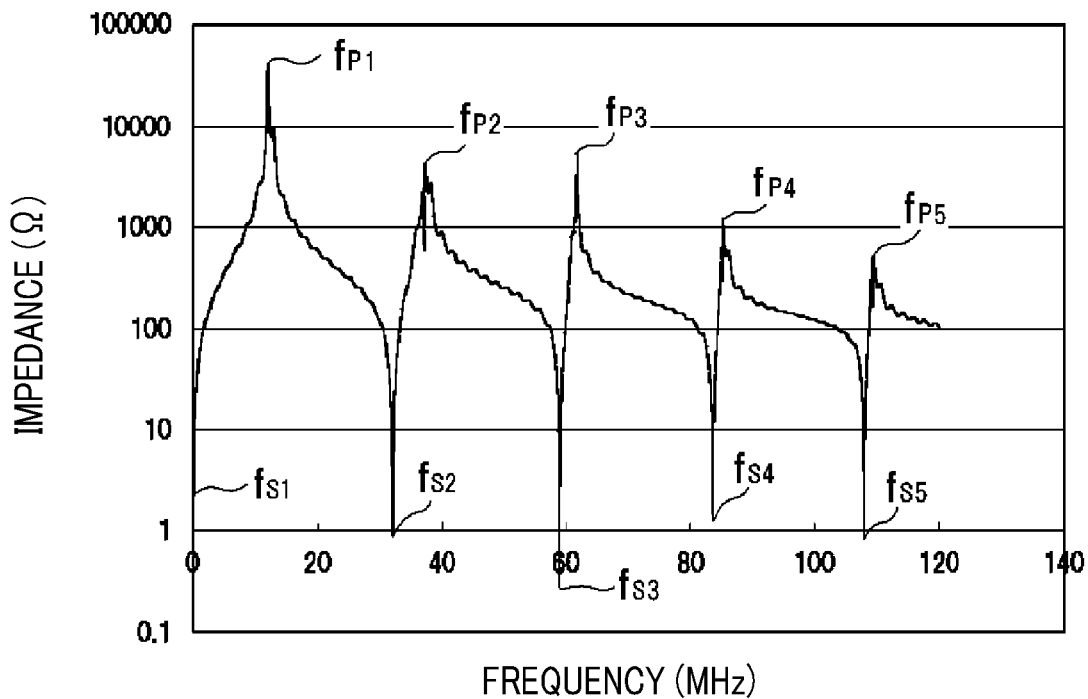
FIG. 11 is a diagram showing an example frequency-impedance characteristic when an air-core solenoid coil has the winding pitch distribution of FIG. 10.

By way of example, when the frequency of the first high frequency power HF is 40 MHz, impedance equal to or higher than several hundreds of angstroms (Ω) is obtained according to the frequency-impedance characteristic of FIG. 11. Thus, the noise of the first high frequency power HF introduced into the power feed line 80A (80B) can be completely blocked in the first-stage filter circuit composed of the air-core solenoid coil $AL_1$($BL_1$) and the first capacitor $AC_1$ ($BC_1$).

Figure 12:
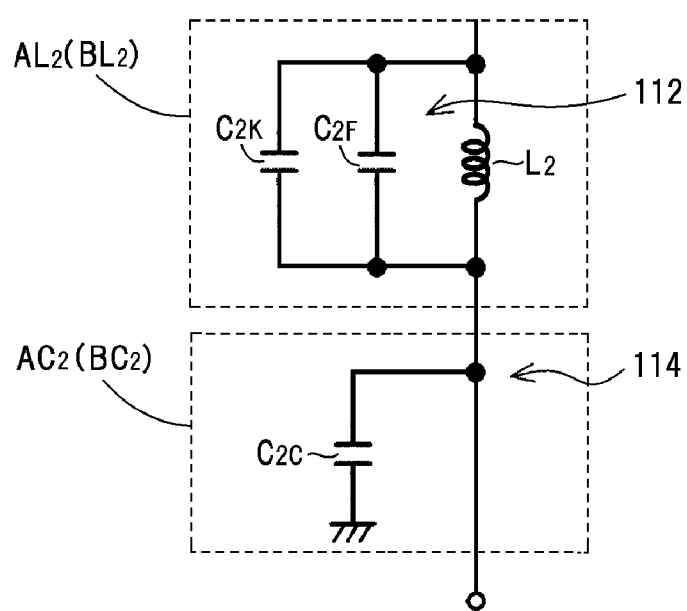
FIG. 12 is a circuit diagram showing an equivalent circuit around the troidal coil.

FIG. 12 depicts an equivalent circuit of the troidal coil $AL_2$ ($BL_2$) and the second capacitor $AC_2$ ($BC_2$). The troidal coil $AL_2$ ($BL_2$) not only provides an inductor $L_2$ or an inductive element having self-inductance, but also has an inter-coil-wire capacitor $C_{2K}$ generated in the vicinity of the inductor $L_2$ and a ground stray capacitor $C_{2F}$ generated between the coil and the housing 82. In the equivalent circuit, the capacitors $C_{2K}$ and $C_{2F}$ are connected to the inductor $L_2$ in parallel.

Here, inductance of the inductor $L_2$ of the troidal coil $AL_2$ ($BL_2$) is represented by the following equation (1).

$$L_2 = N^2 \times \mu \times t \times \ln(b/a)/2\pi \quad (1)$$

Here, N denotes a winding number; μ, magnetic permeability; t, a thickness (height); a, an inner radius; b, an outer radius.

In the present exemplary embodiment, as stated above, a core material (e.g., ferrite) having high permeability is used as the troidal core 106. Further, by setting the thickness (height) t of the troidal core 106 to be at least twice (desirably, four or more times) as large as the typical thickness and selecting the winding number N to be large enough, the inductance of the inductor $L_2$ can be set to be a considerably high value (e.g., 100 μH or higher).

The capacitance of the inter-coil-wire capacitor $C_{2K}$ depends on the winding interval (pitch) of the coil $AL_2$ ($BL_2$), not on the winding number N. Meanwhile, the capacitance of the ground stray capacitor $C_{2F}$ depends on a distance from the housing 82 and a total area of a coil surface facing the housing 82. Accordingly, in the troidal coil $AL_2$ ($BL_2$), as long as the diameter of the housing 82 and the size of the troidal core 106 are constant, the inductance of the inductor $L_2$ and the capacitance of the ground stray capacitor $C_{2F}$ increase as the coil winding number increases.

Particularly, since the troidal core 106, which is formed by stacking the individual troidal cores TC in the multiple levels and thus has the large thickness (height) t, has a large coil surface area per a single turn, the capacitance of the ground stray capacitor $C_{2F}$ is considerably large, and may be equal to or larger than four times or five times the inter-coil-wire capacitor $C_{2K}$ (e.g., equal to or larger than 20 pF).

As stated above, in the troidal coil $AL_2$ ($BL_2$), the low inductance of the inductor $L_2$ and the larger capacitance of the ground stray capacitor $C_{2F}$ than the capacitance of the inter-coil-wire capacitor $C_{2K}$ are advantageous (appropriate) to set a self-resonance frequency of the troidal coil $AL_2$ ($BL_2$), i.e., a second parallel resonance frequency $f_{PL}$ applied from a second parallel resonance circuit 112 to be described below to a sufficiently low frequency range.

In the equivalent circuit (FIG. 12) as described above, the parallel resonance circuit 112 having the parallel resonance frequency $f_{PL}$ within a very low frequency range is formed by the inductor $L_2$ of the troidal coil $AL_2$ ($BL_2$), the inter-coil-wire capacitor $C_{2K}$ and the ground stray capacitor $C_{2F}$. Here, the parallel resonance frequency $f_{PL}$ is the self-resonance frequency of the troidal coil $AL_2$ ($BL_2$) and is expressed by the following equation (2).

$$f_{PL} = 1/2\pi\sqrt{L_2(C_{2K}+C_{2F})} \quad (2)$$

Figure 13:
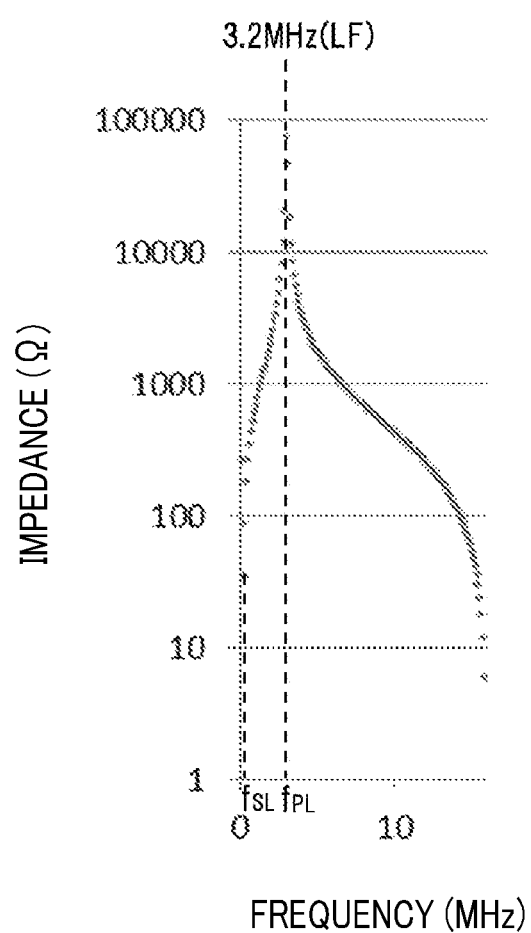
FIG. 13 is a diagram showing an example frequency-impedance characteristic of the equivalent circuit around the troidal coil.

FIG. 13 illustrates an example of the frequency-impedance characteristic obtained by the next-stage filter circuit composed of the troidal coil $AL_2$ ($BL_2$) and the second capacitor $AC_2$ ($BC_2$) when the basic frequency of the second high frequency power LF is 3.2 MHz.

In the shown frequency-impedance characteristic, the parallel resonance frequency $f_{PL}$ is substantially equal to the basic frequency (3.2 MHz) of the second high frequency power LF, which can be easily achieved. That is, as mentioned above, if the winding number N of the troidal coil $AL_2$ ($BL_2$) is changed, the inductance of the inductor $L_2$ and the capacitance of the ground stray capacitor $C_{2F}$ are changed in the same tendency according to the changing amount of the winding number N, though there is no change in the capacitance of the inter-coil-wire capacitor $C_{2K}$. Thus, the second parallel resonance frequency $f_{PL}$ changes smoothly according to the above equation (2). Further, if the stacking number of the troidal cores TC forming the troidal core 106 is changed, the inductance of the inductor $L_2$ and the capacitance of the ground stray capacitor $C_{2F}$ are changed sharply in the same direction, so that the parallel resonance frequency $f_{PL}$ is changed in the step shape according to the above equation (2). Therefore, by changing the stacking number of the troidal cores TC forming the troidal core 106 in case of adjusting the parallel resonance frequency roughly and, also, by changing the winding number N of the troidal coil $AL_2$ ($BL_2$) in case of adjusting the parallel resonance frequency precisely, the parallel resonance frequency $f_{PL}$ can be made approximately equal to the basic frequency (3.2 MHz) of the second high frequency power LF.

Since the characteristic near the parallel resonance frequency $f_{PL}$ has a margin (i.e., is broad), it is still possible to apply sufficiently high impedance to the noise of the second high frequency power LF even if the parallel resonance frequency $f_{PL}$ is slightly deviated from the basic frequency (3.2 MHz) of the second high frequency power LF.

As discussed above, in the filter 84A (84B) according to the present exemplary embodiment, the first-stage air-core solenoid coil $AL_1$ ($BL_1$) is configured to form, by being combined with the housing 82 as the outer conductor, the distributed constant line in which parallel resonance occurs at multiple frequencies. These first-stage air-core solenoid coil $AL_1$ ($BL_1$) performs the filter blocking function, with sufficiently high impedance, the noise of the first high frequency power HF having the higher frequency introduced into the heater power feed line 80A (80B) from the heating element 40 within the susceptor 12, while allowing the noise of the second high frequency power LF having the lower frequency, which is introduced along with the noise of the first high frequency power HF, to pass therethrough. The next-stage troidal coil $AL_2$ ($BL_2$) having the self (parallel)-resonance frequency $f_{PL}$ equal to or approximate to the basic frequency of the second high frequency power LF has also the filter blocking function of blocking, with sufficiently high impedance, the noise of the second high frequency power LF having passed through the first-stage air-core solenoid coil $AL_1$ ($BL_1$). Since the parallel resonance frequency of the air-core solenoid coil $AL_1$ ($BL_1$) and the self-resonance frequency $f_{PL}$ of the troidal coil $AL_2$ ($BL_2$) are independent from each other, it is possible to adjust these frequencies independently in the respective coils, as stated above.

Moreover, in this exemplary embodiment, the comb-teeth members 86 or 98 extended in parallel to the coil axis direction are provided in the vicinity of or within the air-core solenoid coils $AL_1$ and $BL_1$. Further, comb teeth M which are formed at the inner surfaces or the outer surfaces of the comb-teeth members 86 or 98 and have a pitch m corresponding to the winding pitch p are inserted into winding gaps of the air-core solenoid coils $AL_1$ and $BL_1$.

With this configuration, since the winding pitch p of the air-core solenoid coils $AL_1$ and $BL_1$ is accurately set to a preset value by the comb-teeth pitch m, the frequency-impedance characteristic or filter characteristic having high reproducibility and no object difference can be obtained. Furthermore, since the air gaps G are formed in winding gaps of the air-core solenoid coils $AL_1$ and $BL_1$ except where the comb teeth M are inserted, heat generated from the coil is rapidly discharged out through the air gaps G. Therefore, the air-core solenoid coils $AL_1$ and $BL_1$ can be cooled efficiently.

<Other Exemplary Embodiments Regarding Air-Core Solenoid Coils>

In the above-described exemplary embodiment, in the filter unit 54(IN), the winding pitch p of the air-core solenoid coils $AL_1$ and $BL_1$ is uniform (constant value $p_s$) from one ends to the other ends of the coils (FIG. 4 and FIG. 10), and a frequency-impedance characteristic of multiple parallel resonance in which impedance increases in a conical shape at a regular frequency interval is obtained, as shown in FIG. 11, for example. Accordingly, if the frequency of the noise of each of the high frequency powers (particularly, the first high frequency power HF) among the high frequency powers except the second high frequency power LF having the lowest frequency, which are introduced to the power feed lines 80A and 80B through the susceptor 12 and the heating element 40, is designed to be equal to or approximate to any one parallel resonance frequency of the multiple parallel resonance, such a high frequency noise in the high frequency range can be effectively blocked by the filter unit 54(IN).

However, in the aforementioned filter configuration where the winding pitch of the air-core solenoid coils $AL_1$ and $BL_1$ is uniform (constant value $p_s$) over the entire length S, since the parallel resonance frequencies are obtained at a regular frequency interval, it is very difficult to match any one of the parallel resonance frequency of the multiple parallel resonance with the frequency of the first high frequency power HF, which is selected or changed in consideration of various aspects such as the kind or specification of a process involved.

For example, when the frequency of the first high frequency power HF is 40 MHz, impedance against the noise of the first high frequency power HF is just several hundreds of angstroms ($\Omega$) and does not reach 1000 $\Omega$ or higher in the frequency-impedance characteristic of FIG. 11. Furthermore, when there is a need or request to change the frequency of the first high frequency power HF from 40 MHz to 60 MHz, the impedance would be greatly lowered because a third serial resonance frequency $f_{S3}$ is about 60 MHz. Thus, it is difficult to efficiently respond to the need or request to change the frequency of the first high frequency power HF.

To solve this problem, in the prior art described in Patent Document 1, by providing a ring-shaped member between the air-core solenoid coils $AL_1$ and $BL_1$ and the housing (outer conductor) 82 in the filter unit 54(IN), the gap of the coaxial line is narrowed locally. Accordingly, C (electrostatic capacitance per a unit length) is changed, and, also, the characteristic impedance $Z_o=\sqrt{(L/C)}$ is changed locally. Thus, a part or all of resonance frequencies of the multiple parallel resonance may be shifted.

In contrast, in the filter unit 54(IN) according to the present exemplary embodiment, instead of providing such the ring-shaped member, the air-core solenoid coils $AL_1$ and $BL_1$ are divided to multiple sections $K_1$, $K_2$, . . . in the coil axis direction. By setting or adjusting the winding pitch p of the air-core solenoid coils $AL_1$ and $BL_1$ for each section $K_i$ (i=1, 2, . . . ) independently, the characteristic impedance $Z_o=\sqrt{(L/C)}$ is changed in each section without changing the gap of the coaxial line, so that a part or all of resonance frequencies of the multiple parallel resonance can be shifted. In this case, in each section $K_i$, as the winding pitch p of the air-core solenoid coils $AL_1$ and $BL_1$ is decreased, C and L per a unit length are increased, so that the characteristic impedance $Z_o=\sqrt{(L/C)}$ is increased. On the contrary, as the winding pitch p of the air-core solenoid coils $AL_1$ and $BL_1$ is increased, C and L per a unit length are decreased, so that the characteristic impedance $Z_o=\sqrt{(L/C)}$ is decreased.

Figure 14:
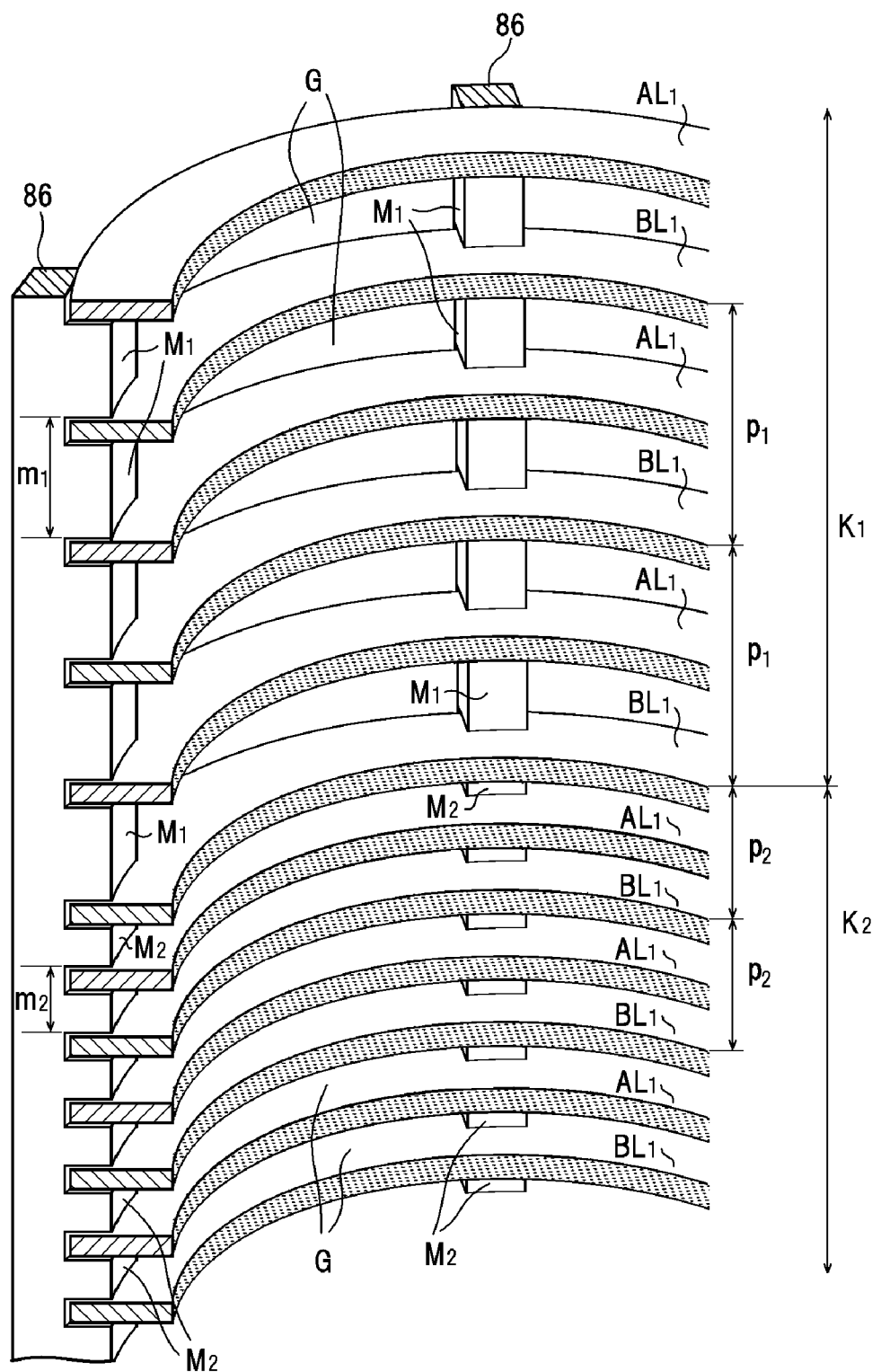
FIG. 14 is a perspective view illustrating another example configuration regarding a winding pitch and comb teeth of the air-core solenoid coil.
Figure 15:
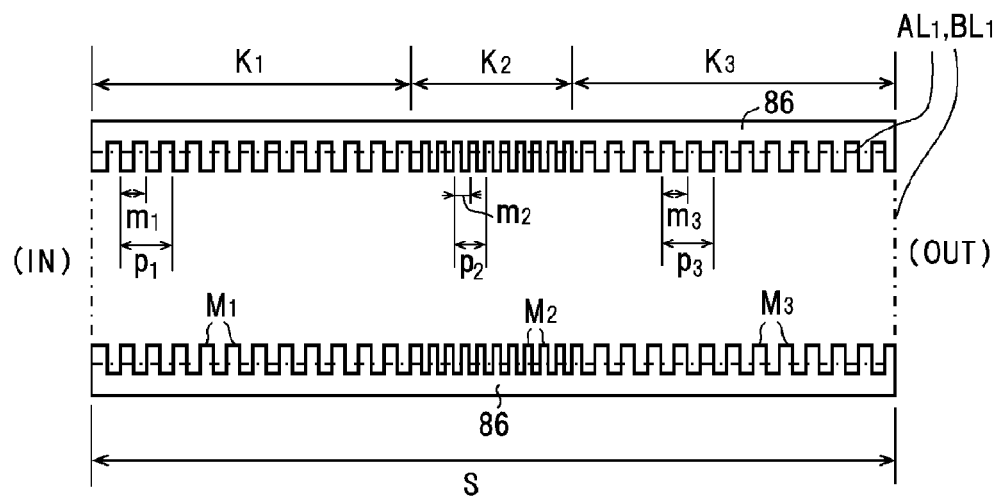
FIG. 15 is a diagram schematically illustrating a division pattern of the air-core solenoid coil regarding the winding pitch in the example of FIG. 14.

In this exemplary embodiment, as a division form (pattern) for dividing the air-core solenoid coils $AL_1$ and $BL_1$ to the multiple sections $K_1$, $K_2$, . . . regarding the winding pitch as stated above, a division pattern as depicted in FIG. 14 and FIG. 15, for example, may be employed.

In this division pattern, as shown in FIG. 15, the air-core solenoid coils $AL_1$ and $BL_1$ are divided to three sections $K_1$, $K_2$ and $K_3$ at a length ratio of 2:1:2 from an inlet (IN) of the filter unit 54(IN) toward an outlet (OUT) thereof when viewed from the side of the coil terminals TA and TB, and a ratio between winding pitches $p_1$, $p_2$ and $p_3$ of these three sections $K_1$, $K_2$ and $K_3$ is set to be 2:1:2. In this case, with respect to the winding pitch $p_s$ in the case (FIG. 10) where the air-core solenoid coils are not divided to the multiple sections, by setting $p_1=1.12p_s$, $p_2=0.56p_s$, $p_3=1.12p_s$, the entire length S of the coil can be maintained same.

Moreover, as depicted in FIG. 14, the comb-teeth members 86 (98) extended in parallel to the coil axis direction are provided in the vicinity of or within the air-core solenoid coils $AL_1$ and $BL_1$ in order to divide the air-core solenoid coils $AL_1$ and $BL_1$ to the three sections $K_1$, $K_2$ and $K_3$ regarding the winding pitch p. Further, comb teeth $M_i$ which are formed at the inner surfaces or the outer surfaces of the comb-teeth members 86 (98) and have a pitch $m_i$ corresponding to the winding pitch $p_i$ in each section $K_i$ are inserted into winding gaps of the air-core solenoid coils $AL_1$ and $BL_1$.

Figure 16:
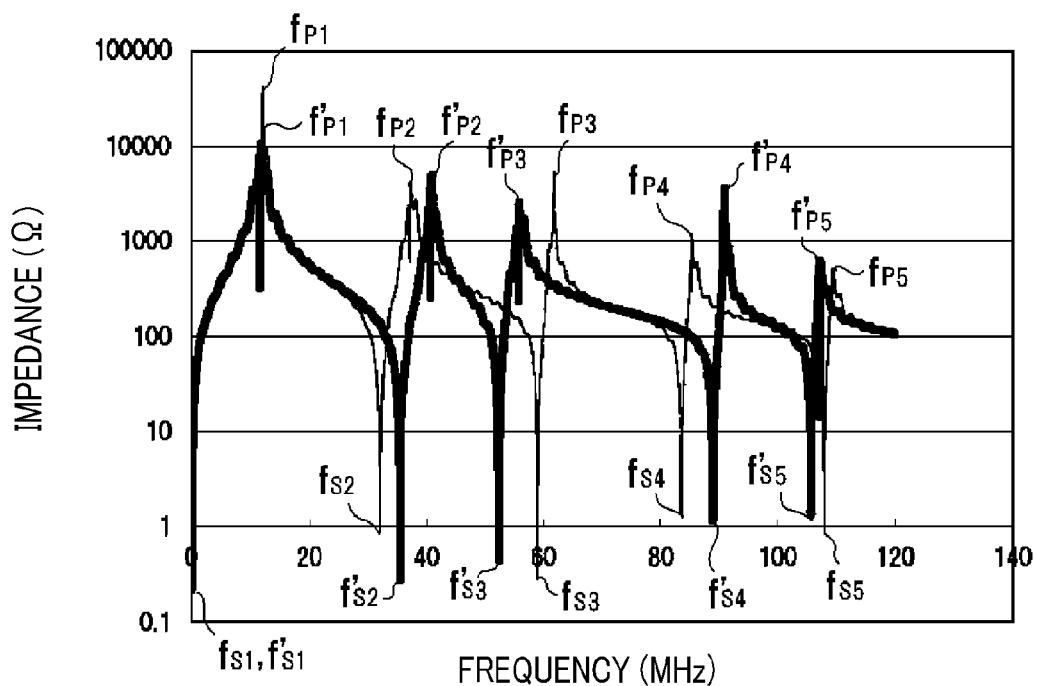
FIG. 16 is a diagram showing an example frequency-impedance characteristic when an air-core solenoid coil has the division pattern regarding the winding pitch of FIG. 15.

FIG. 16 depicts a frequency-impedance characteristic of the first-stage filter circuit obtained by the electromagnetic field computation when using the above-described division pattern (FIG. 15), in comparison with a frequency-impedance characteristic (FIG. 11) obtained when the winding pitch is uniform. As shown therein, second serial/parallel resonance frequencies and fourth serial/parallel resonance frequencies are shifted to higher frequency ranges ($f_{s2} < f'_{s2}$), ($f_{p2} < f'_{p2}$), ($f_{s4} < f'_{s4}$), ($f_{p4} < f'_{p4}$), respectively, and third serial/parallel resonance frequencies and fifth serial/parallel resonance frequencies are shifted to lower frequency ranges ($f_{s3} > f'_{s3}$), ($f_{p3} > f'_{p3}$), ($f_{s5} > f'_{s5}$), ($f_{p5} > f'_{p5}$), respectively.

By the shifts of the resonance frequencies, high impedance equal to or higher than 1000Ω can be obtained at the frequency of 40 MHz, and high impedance equal to or higher than several hundreds of angstroms (Ω) can also be obtained even at the frequency of 60 MHz. Accordingly, in the plasma processing apparatus according to the above-described exemplary embodiment, when the frequency of the first high frequency power HF is 40 MHz, the blocking function of the filter 84A (84B) against the noise of the first high frequency power HF can be further improved, and can also be applied in the case where the frequency of the first high frequency power HF is switched into the two frequencies of 40 MHz and 60 MHz.

Further, the above-stated division pattern (FIG. 15) is nothing more than an example, and various selections or modifications may be made regarding the number of the division sections, the distributed forms of winding pitches, and so forth.

Furthermore, in order to shift a part of the resonance frequencies among the multiple parallel resonance characteristics of the filter 84A (84B) selectively as stated above, a ratio between the lengths of the multiple sections $K_1$, $K_2$, . . . set on the air-core solenoid coils $AL_1$ and $BL_1$ and a ratio of winding pitches $p_1$, $p_2$, . . . need to be selected to appropriate values. By way of example, as for the division pattern of FIG. 15, if the first section $K_1$ is extremely short, e.g., S/100 or less, it may be difficult to achieve the effect of shifting a part of the resonance frequencies as shown in FIG. 16. Likewise, when the winding pitch $p_1$ in the first section $K_1$ is different only several % from the winding pitch $p_2$ in the second section $K_2$, such a shifting effect for a part of the resonance frequencies may not be achieved, either.

According to the electromagnetic field computation conducted by the present inventor, it is desirable that the length of the first section $K_1$ is equal to or larger than ⅕ of the length of the second section $K_2$, and equal to or smaller than 5 times the length of the second section $K_2$. Further, it is also desirable that the winding pitch $p_1$ of the first section $K_1$ is equal to or larger than twice the winding pitch $p_2$ of the second section $K_2$, or equal to or less than ½ the winding pitch $p_2$ of the second section $K_2$.

<Other Exemplary Embodiments Regarding Plasma Processing Apparatus>

Figure 17:
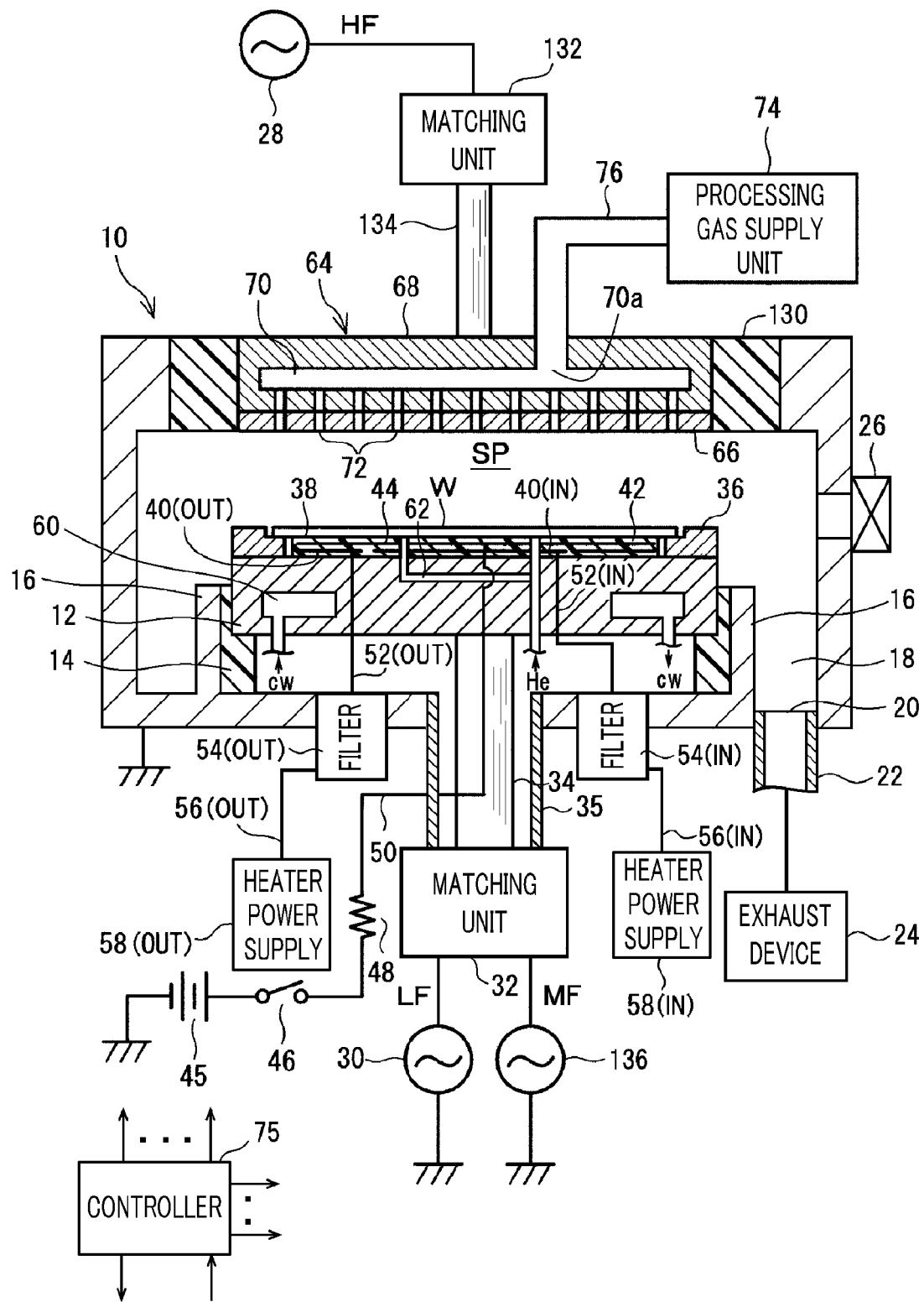
FIG. 17 is a cross sectional view illustrating a configuration of a plasma processing apparatus according to a modification example.

FIG. 17 illustrates a configuration of a plasma processing apparatus according to a modification example. In the drawing, parts having the same configuration or function in the plasma processing apparatus (FIG. 1) of the above-described exemplary embodiment will be assigned same reference numerals.

This plasma processing apparatus is configured as a capacitively coupled plasma etching apparatus of applying dual high frequency powers to the lower electrode and a single high frequency power to the upper electrode. This plasma processing apparatus is mainly different from the plasma processing apparatus (FIG. 1) of the above-described exemplary embodiment in that the first high frequency power HF for plasma generation is applied to the upper electrode 64, and the second and a third high frequency power LF and MF having different frequencies are applied to the susceptor 12 in an overlapped manner to control energy (bias) of ions attracted to the semiconductor wafer W in various ways with higher degree of freedom. Here, the frequency of the third high frequency power MF is set to be a value (e.g., 12.88 MHz) higher than the frequency (e.g., 3.2 MHz) of the second high frequency power LF.

In this plasma processing apparatus, the upper electrode 64 is provided to a top surface of the chamber 10 via the ring-shaped insulator 130. The first high frequency power supply 28 configured to output the first high frequency power HF for plasma generation is electrically connected to the upper electrode 64 via the matching unit 132 and an upper power feed rod 134. Further, the second high frequency power supply 30 configured to output the second high frequency power LF and a third high frequency power supply 136 configured to output the third high frequency power MF are electrically connected to the susceptor 12 via matching devices (not shown) within the matching unit 32 and the lower power feed rod 34. The controller 75 is configured to control a total power of the second and third high frequency powers LF and MF outputted from the high frequency power supplies 30 and 136, respectively, and a power ratio therebetween based on specifications and conditions of the etching process or according to a recipe.

In this plasma processing apparatus, the filter units 54(IN) and 54(OUT) having the same configuration and function as those in the plasma processing apparatus (FIG. 1) may also be provided on the heater power feed line. Particularly, if a frequency-impedance characteristic shown in FIG. 16 is obtained by dividing, regarding the winding pitch p, the air-core solenoid coil $AL_1(BL_1)$ to three sections $K_1$, $K_2$ and $K_3$ according to the division pattern as shown in FIG. 15, it is possible to block any noises of the first to third high frequency powers HF, LF and MF, which are introduced into the heater power feed lines 80A and 80B from the heater element 40 of the susceptor 12, with sufficiently high impedance by using a filter configuration including the single air-core solenoid coil $AL_1(BL_1)$ and the single troidal coil $AL_2$ ($BL_2$) as in the above-described exemplary embodiment.

That is, the first-stage air-core solenoid coil $AL_1$ ($BL_1$) configured to form, by being combined with the housing 82 as the outer conductor, a distributed constant line in which parallel resonance occurs at multiple frequencies is capable of exerting a stable and secure filter blocking function against a noise of the third high frequency power MF (12.88 MHz) with sufficiently high impedance near the first parallel resonance frequency $f_{p1}$, and, also, capable of exerting a stable and secure filter blocking function against the noise of the first high frequency power HF (40 MHz or 60 MHz) with sufficiently high impedance near the second parallel resonance frequency $f_{p2}$ or the third parallel resonance frequency $f_{p3}$. Further, the next-stage troidal coil $AL_2$ ($BL_2$) is capable of providing a stable and secure filter blocking function against the noise of the second high frequency power LF (3.2 MHz), which is introduced through the first-stage air-core solenoid coil $AL_1$ ($BL_1$), with sufficiently high impedance near the self-resonance frequency $f_{PL}$.

Other Exemplary Embodiments or Modification Examples

Figure 18:
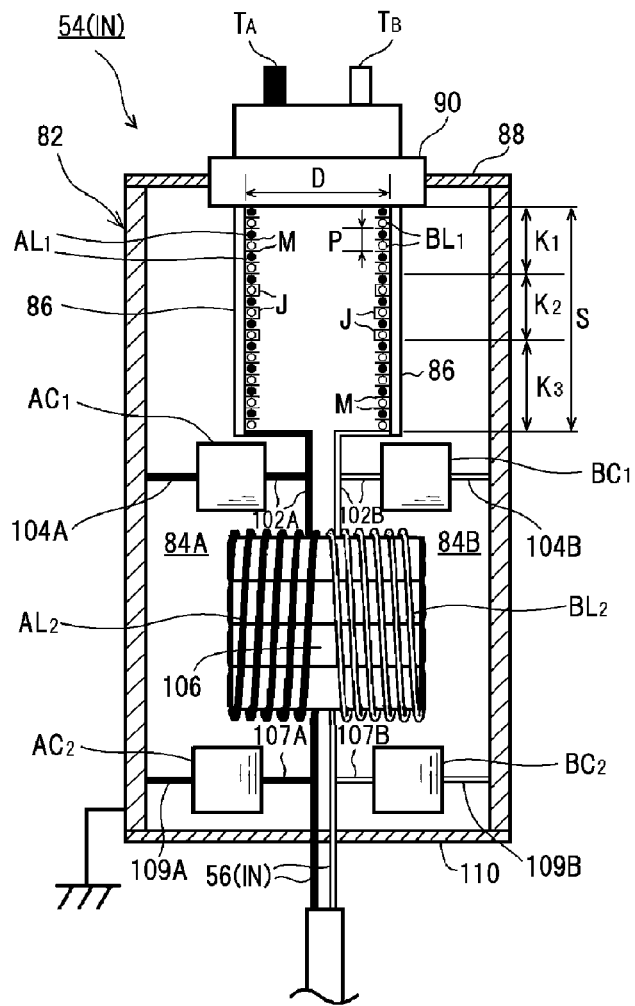
FIG. 18 is a longitudinal cross sectional view illustrating a physical structure within a filter unit according to a second exemplary embodiment.

FIG. 18 illustrates a physical structure within the filter unit 54(IN) according to another exemplary embodiment. In this exemplary embodiment, the air-core solenoid coils $AL_1$ and $BL_1$ are divided to multiple sections $K_1$, $K_2$, . . . in the coil axis direction, and winding gaps in a single section, e.g., $K_2$, are blocked by a coil tube J in the entire circumferential direction. In the other sections, e.g., $K_1$ and $K_3$, the comb teeth M of the comb-teeth members 86 (98) are inserted into the winding gaps locally in the circumferential direction, as in the above-described exemplary embodiment. The other configuration is mostly the same as that of the above-described exemplary embodiment.

Figure 19:
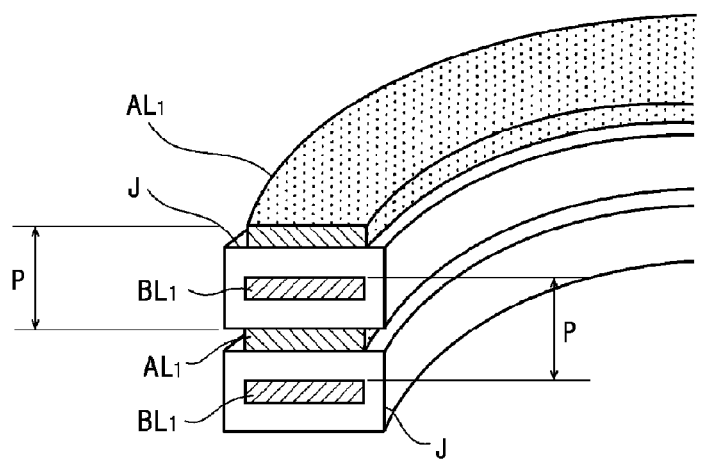
FIG. 19 is a partially enlarged perspective view illustrating major parts (inter-winding structure of a coil) of an air-core solenoid coil in the second exemplary embodiment of FIG. 18.

In this case, in the section $K_2$ where the coil tube J is used, typically, a coil conductor of only one air-core solenoid coil $BL_1$ is put through the coil tube J, as shown in FIG. 19. Without putting a coil conductor of the other air-core solenoid coil $AL_1$ through the coil tube J, a constant winding pitch p and electrical insulation between both coils $AL_1$ and $BL_1$ can be obtained. However, it may be also possible to adopt a configuration in which coil conductors of both coils $AL_1$ and $BL_1$ are put through the respective coil tube J.

In this exemplary embodiment, as in the above-described exemplary embodiment, instead of providing the ring member between the air-core solenoid coils $AL_1$ and $BL_1$ and the housing 82 of the outer conductor within the filter unit 54(IN), a physical characteristic of the solenoid coils $AL_1$ and $BL_1$, which determines C and/or L of the coaxial line, is set or adjusted independently for each of the multiple sections. Thus, a characteristic impedance $Z_o=\sqrt{(L/C)}$ is changed in each section without changing the gap of the coaxial line, so that a part or all of resonance frequencies of multiple parallel resonance are shifted.

More specifically, in the inter-winding structure, the air-core solenoid coils $AL_1$ and $BL_1$ are divided to the multiple sections $K_1$, $K_2$, . . . as stated above, and in one of the sections, the comb teeth M are inserted into the winding gaps, whereas in the other sections, the winding gaps are blocked by the coil tube J. Accordingly, C and L of the coaxial line are changed in each section, and, thus, the characteristic impedance $Z_o=\sqrt{(L/C)}$ is changed in each section, so that a part or all of the resonance frequencies of the multiple parallel resonance can be shifted.

For example, in a division pattern of FIG. 18, in the sections $K_1$ and $K_3$ where the comb teeth M are inserted into the winding gaps, as the winding pitch p decreases, C and L per a unit length are increased, so that the characteristic impedance $Z_o=\sqrt{(LC)}$ is also increased. On the contrary, as the winding pitch p increases, C and L per a unit length are decreased, so that the characteristic impedance $Z_o=\sqrt{(LC)}$ is also decreased. Furthermore, in the section $K_2$ where the winding gaps are blocked by the coil tube J, if the winding pitch p therein is constant, C per a unit length increases as a dielectric constant £ of the coil tube J increases, so that the characteristic impedance $Z_o=\sqrt{(LC)}$ is also increased. On the contrary, as the dielectric constant £ of the coil tube J decreases, C per a unit length is also decreased, so that the characteristic impedance $Z_o=\sqrt{(LC)}$ is decreased.

Figure 20:
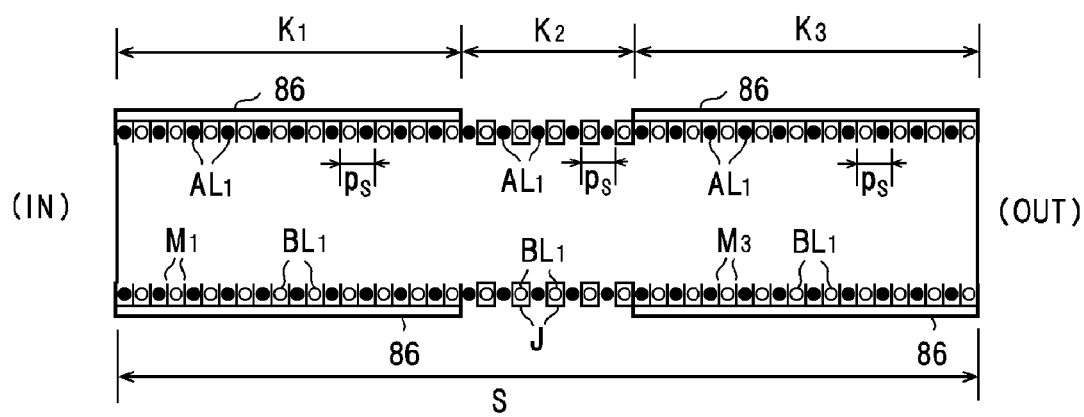
FIG. 20 is a diagram schematically illustrating a division pattern of the air-core solenoid coil regarding a winding pitch in the second the exemplary embodiment of FIG. 18.

The present inventor has acquired, by the electromagnetic field computation, the frequency-impedance characteristics of the first filter 84(A) having the division pattern of the air-core solenoid coil $AL_1$ as shown in FIG. 18 and FIG. 20.

Figure 21:
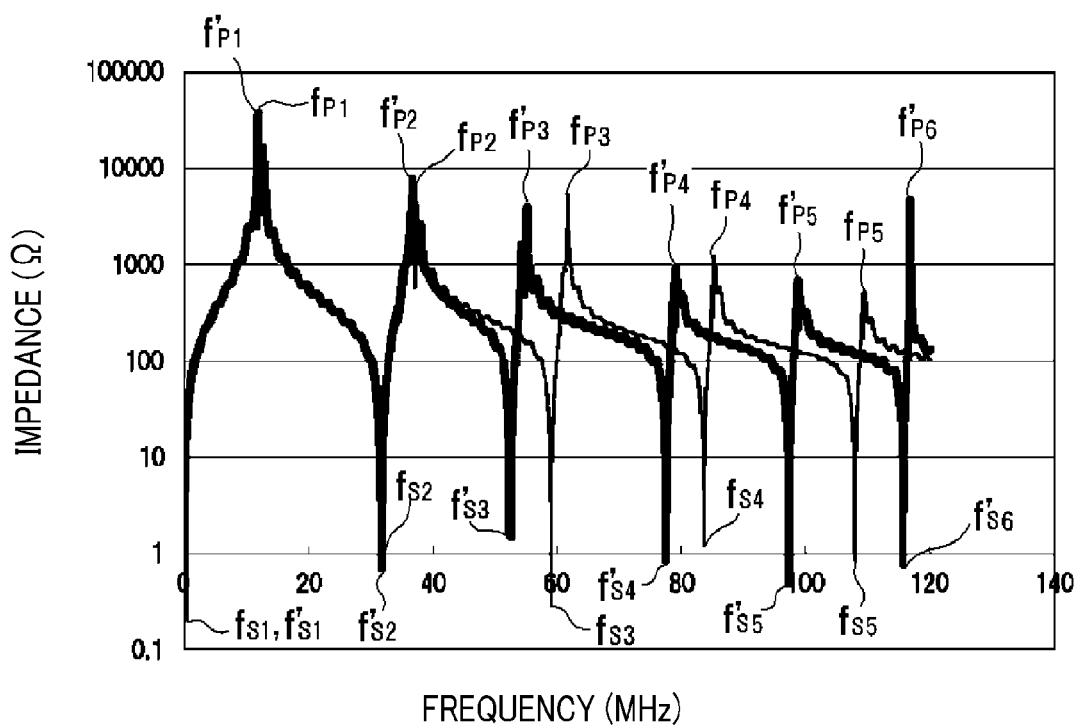
FIG. 21 is a diagram showing an example frequency-impedance characteristic when an air-core solenoid coil has the division pattern regarding the winding pitch of FIG. 20.

Then, the frequency-impedance characteristic acquired for this division pattern is compared with a frequency-impedance characteristic obtained by the electromagnetic field computation for a configuration (FIG. 10) where the coils are not divided to multiple sections, the winding pitch is set to be uniform (constant value $p_s$), and the comb teeth M are inserted into the winding gaps from one end to the other end of the coil. In this electromagnetic filed computation, the dielectric constant of the coil tube J is set to have a value of 4. By way of non-limiting example, if the coil tube J is made of PEEK, the dielectric constant value of 4 can be obtained. As depicted in FIG. 21, all of the serial resonance frequencies and the parallel resonance frequencies after the third ones are shifted to lower frequency ranges ($f_{s3}>f'_{s3}$), ($f_{p3}>f'_{p3}$)≈($f_{s6}>f'_{s6}$), ($f_{p6}>f'_{p6}$), respectively.

In this exemplary embodiment, various selections and modifications may be made regarding the number of division sections, patterns in which a section in which the comb teeth M are inserted into the winding gaps, and a section, in which the winding gaps are blocked by the coil tube J, are mixed, and so forth.

Figure 22:
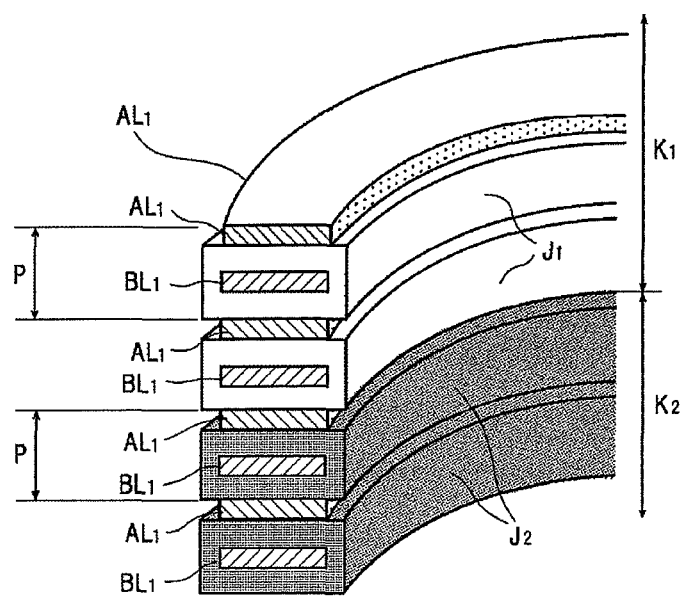
FIG. 22 is a partially enlarged perspective view illustrating major parts (inter-winding structure of a coil) according to another example.

Further, as another exemplary embodiment shown in FIG. 22, it may be possible to adopt a configuration in which the air-core solenoid coils $AL_1$ and $BL_1$ are divided to multiple sections $K_1$, $K_2$, . . . in the inter-winding structure, and the winding gaps in some sections (e.g., the section $K_1$) are blocked in the entire circumferential direction by a first coil tube $J_1$ having a first dielectric constant, and the winding gaps in other sections (e.g., the section $K_2$) are blocked in the entire circumferential direction by a second coil tube $J_2$ having a second dielectric constant. As an example, the first coil tube $J_1$ may be made of Teflon (registered trademark) having a dielectric constant of 1, and the second coil tube $J_2$ may be made of PEEK having a dielectric constant of 4.

In the above-described exemplary embodiments, within the single outer conductor (housing) 82, the coil conductor forming the solenoid coil $AL_1$ of the first filter 84A and the coil conductor forming the solenoid coil $BL_1$ of the second filter 84B are spirally wound while being overlapped. In this coil winding structure, self-inductance between both air-core solenoid coils $AL_1$ and $BL_1$ are same each other, and maximum mutual inductance can be obtained. As a result, a RF power loss in the filter unit 54(IN) is reduced, and an apparatus difference in the RF power loss is reduced. Further, though not illustrated, it is also possible to adopt a configuration in which the air-core solenoid coil $AL_1$ of the first filter 84A and the air-core solenoid coil $BL_1$ of the second filter 84B are accommodated in outer conductors (housings) 82, respectively. In such a case, when the aforementioned comb-teeth members 86 or 98 are provided, a winding pitch p and a comb-teeth pitch m are same, and a relationship of p=m is established.

Further, in the above-described exemplary embodiment, the coil conductor of the troidal coil $AL_2$ ($BL_2$) is wound around the single troidal core 106 which is composed of the multiple troidal cores TC stacked on top of each other. An assembly of a plurality of this type of troidal coil connected in series without capacitors provided therebetween may be used as a single troidal coil or a single set of troidal coils.

Figure 23:
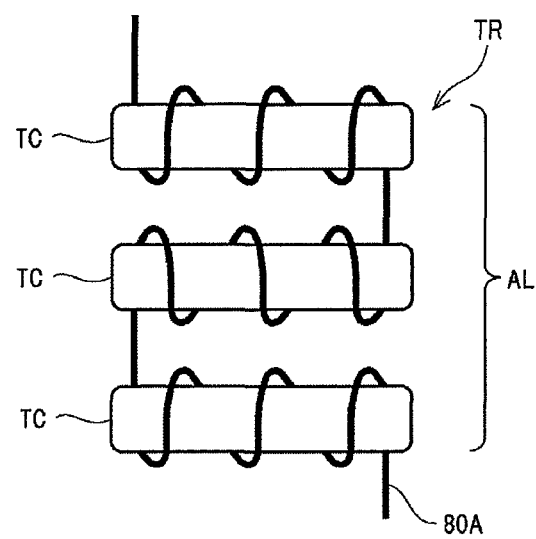
FIG. 23 is a diagram illustrating a modification example of the troidal core.

Furthermore, as depicted in FIG. 23, there may be used a complex type troidal coil AL which is prepared by connecting in series a plurality of (three in the shown example) troidal coils TR, each of which is composed of the coil conductor wound around the single-body troidal core TC. In FIG. 23, only the troidal coil AL on the first power feed line 80A is shown, while a troidal coil BL on the second power feed line 80B is not illustrated.

In the above-described exemplary embodiment, the capacitors $AC_1$ ($BC_1$) and $AC_2$ ($BC_2$) respectively included in the filter 84A (84B) are accommodated within the housing 82. However, a part or all of these capacitors may be provided at the outside of the housing 82. Moreover, a ground potential member other than the housing 82 may be used for these capacitors. In addition, the troidal coils $AL_2$ and $BL_2$ and the air-core solenoid coils $AL_1$ and $BL_1$ may be accommodated in separate housings 82. Further, the troidal coils $AL_2$ and $BL_2$ may be substituted with other types of coils having a core, for example, a solenoid coil having a core.

The above-described exemplary embodiments are directed to a filter configured to, in a capacitively coupled plasma etching apparatus of a lower electrode dual frequency application type in which the first high frequency power HF for plasma generation and the second high frequency power LF for ion attraction are applied to the susceptor 12 in the overlapped manner within the chamber 10, reduce noises of both high frequency powers on a pair of the heater power feed lines 80A and 80B electrically connecting the heating element 40 mounted in the susceptor 12 and the heater power supplies 58(IN) and 58(OUT) provided outside the chamber 10. However, the filter or the filter unit of the above-described exemplary embodiments may be properly applied to a capacitively coupled plasma etching apparatus of an upper-and-lower electrode dual frequency application type configured to apply the first high frequency power HF for plasma generation to an upper electrode 64 while applying the second high frequency power LF for ion attraction to the susceptor 12, or a capacitively coupled plasma etching apparatus of a lower electrode single frequency application type configured to apply a single high frequency power to the susceptor 12.

Further, by using multiple parallel resonance of the distributed constant line formed by the air-core solenoid coil $AL_1(BL_1)$ and the housing 82 as the outer conductor, it is also possible to block a noise of a harmonic generated from the high frequency powers HF and LF applied for a plasma process (especially, a second harmonic of the first high frequency power HF).

Furthermore, the exemplary embodiments are not limited to the filter for a power cable such as the heater power feed line, but may also be applicable to any filter or filter unit provided on a pair of lines or a single line configured to electrically connect an electrical member within a chamber and an external circuit of a power meter or a signal meter provided outside the chamber.

The present exemplary embodiment may not be limited to the capacitively coupled plasma etching apparatus but can be applied to various types of plasma etching apparatuses such as a microwave plasma etching apparatus, an inductively coupled plasma etching apparatus, a helicon wave plasma etching apparatus, etc. and, also, can be applied to other plasma processing apparatuses such as a plasma CVD apparatus, a plasma oxidizing apparatus, a plasma nitriding apparatus, a sputtering apparatus, etc. Further, the processing target substrate may not be limited to the semiconductor wafer but may be a photomask, a CD substrate, a print substrate, or one of various types of substrates for a flat panel display, an organic EL and a solar cell.

EXPLANATION OF REFERENCE NUMERALS

10: Chamber
12: Susceptor (lower electrode)
28: High frequency power supply (for plasma generation)
30: High frequency power supply (for ion attraction)
40(IN): Inner heating wire
40(OUT): Outer heating wire
54(IN), 54(OUT): Filter unit
58(IN), 58 (OUT): Heater power supply
80A, 80B: Power feed line
84A, 84B: Filter
$AL_1$, $BL_1$: Air-core solenoid coil
$AC_1$, $BC_1$: Capacitor:
$AL_2$, $BL_2$: Troidal coil
$AC_2$, $BC_2$: Capacitor
86: Rod-shaped comb-teeth members
98: Plate-shaped comb-teeth members
M, $M_1$ to $M_3$: Comb teeth
J: Coil tube

I claim:

1. A plasma processing apparatus, comprising:
an external circuit of a power meter or a signal meter electrically connected via a line to an electrical member within a processing vessel in which a plasma process is performed; and
a filter provided on the line and configured to reduce or block noises of multiple high frequency powers of different frequencies introduced from the electrical member into the line toward the external circuit
wherein the filter comprises:
an air-core solenoid coil provided at an uppermost portion of the filter when viewed from a side of the electrical member, the air-core solenoid coil configured to block noises of a single or plural high frequency powers among the multiple high frequency powers except a high frequency power having a lowest frequency,
insulating comb teeth inserted in winding gaps of the air-core solenoid coil locally at plural positions in a circumferential direction thereof,
a coil having a core connected in series to the air-core solenoid coil, the coil configured to block a noise of the high frequency power having the lowest frequency, and
a cylindrical conductor, accommodating or surrounding at least the air-core solenoid coil, configured to form, by being combined with the air-core solenoid coil, a distributed constant line in which parallel resonance occurs at multiple frequencies.

2. The plasma processing apparatus of claim 1,
wherein the air-core solenoid coil has a first section and a second section having different winding pitches in a coil axis direction, and the comb teeth have a first comb-teeth pitch and a second comb-teeth pitch that determine the winding pitches of the first section and the second section, respectively.

3. The plasma processing apparatus of claim 2,
wherein the winding pitch of the first section is equal to or larger than twice the winding pitch of the second section, or equal to or less than ½ the winding pitch of the second section.

4. The plasma processing apparatus of claim 2,
wherein a length of the first section is equal to or larger than ⅕ of length of the second section and equal to or smaller than 5 times the length of the second section.

5. The plasma processing apparatus of claim 1,
wherein the comb teeth are formed on an inner surface of a rod-shaped member which is composed of a plurality of insulating members to be extended in parallel to the air-core solenoid coil in a coil axis direction and arranged adjacent to an outer peripheral surface of the air-core solenoid coil.

6. The plasma processing apparatus of claim 1, wherein the comb teeth are formed on an outer surface of a rod-shaped member which is composed of a plurality of insulating members to be extended in parallel to the air-core solenoid coil in a coil axis direction and arranged adjacent to an inner peripheral surface of the air-core solenoid coil.

7. The plasma processing apparatus of claim 1, wherein the comb teeth are formed on an outer surface of a plate-shaped member which is composed of a plurality of insulating members to be provided within the air-core solenoid coil, and which is extended radially to come into contact with an inner peripheral surface of the air-core solenoid coil in a coil radius direction and, also, extended in parallel to the air-core solenoid coil in a coil axis direction.

8. The plasma processing apparatus of claim 1, further comprising:
a first capacitor electrically connected between the cylindrical conductor and a connection point provided between the air-core solenoid coil and the coil having the core.

9. The plasma processing apparatus of claim 1, further comprising:
a second capacitor electrically connected between the cylindrical conductor and a terminal of the coil having the core at a side of the external circuit.

10. The plasma processing apparatus of claim 1, wherein the coil having the core is a troidal coil.

11. The plasma processing apparatus of claim 1, wherein the electrical member is a heating element provided in a high frequency electrode to which a single high frequency power or multiple high frequency powers of different frequencies are applied in order to perform the plasma process,
the external circuit is a heater power supply configured to apply a power for heat generation to the heating element, and
the line is a power feed line configured to electrically connect the heater power supply and the heating element.

12. The plasma processing apparatus of claim 10, wherein, when an inner radius, an outer radius and a thickness of a troidal core of the troidal coil is a, b and t, respectively, there is established a relationship of $t \geq 2(b-a)$.

13. The plasma processing apparatus of claim 10, wherein a troidal core of the troidal coil is composed of a plurality of single-body troidal cores stacked on top of each other, each single-body troidal core having a uniform inner radius, outer radius and thickness.

14. A plasma processing apparatus, comprising:
an external circuit of a power meter or a signal meter electrically connected via a line to an electrical member within a processing vessel in which a plasma process is performed; and
a filter provided on the line and configured to reduce or block noises of multiple high frequency powers of different frequencies introduced from the electrical member into the line toward the external circuit wherein the filter comprises:
an air-core solenoid coil provided at an uppermost portion of the filter when viewed from a side of the electrical member, the air-core solenoid coil configured to block noises of a single or plural high frequency powers among the multiple high frequency powers except a high frequency power having a lowest frequency,
insulating comb teeth inserted in winding gaps of a first section of the air-core solenoid coil locally at plural positions in a circumferential direction thereof,
a coil tube configured to block winding gaps of a second section of the air-core solenoid coil in the entire circumferential direction,
a coil having a core connected in series to the air-core solenoid coil, the coil configured to block a noise of the high frequency power having the lowest frequency, and
a cylindrical conductor, accommodating or surrounding at least the air-core solenoid coil, configured to form, by being combined with the air-core solenoid coil, a distributed constant line in which parallel resonance occurs at multiple frequencies.

15. A filter unit, within a plasma processing apparatus in which an electrical member within a processing vessel in which a plasma process is performed is electrically connected via a line to an external circuit provided outside the processing vessel, provided on the line to reduce or block noises of multiple high frequency powers of different frequencies introduced from the electrical member into the line toward the external circuit, the filter unit comprising:
an air-core solenoid coil provided at an uppermost portion of the filter when viewed from a side of the electrical member, the air-core solenoid coil configured to block noises of a single or plural high frequency powers among the noises of the multiple high frequency powers except a high frequency power having a lowest frequency;
insulating comb teeth inserted in winding gaps of the air-core solenoid coil locally at plural positions in a circumferential direction thereof;
a coil having a core connected in series to the air-core solenoid coil, the coil configured to block a noise of the high frequency power having the lowest frequency; and
a cylindrical conductor, accommodating or surrounding at least the air-core solenoid coil, configured to form, by being combined with the air-core solenoid coil, a distributed constant line in which parallel resonance occurs at multiple frequencies.

16. The filter unit of claim 15, wherein the electrical member is a heating element provided in a high frequency electrode to which a single high frequency power or multiple high frequency powers of different frequencies are applied in order to perform the plasma process,
the external circuit is a heater power supply configured to apply a power for heat generation to the heating element, and
the line is a power feed line configured to electrically connect the heater power supply and the heating element.

17. A filter unit, within a plasma processing apparatus in which a heating element provided in a first electrode within a processing vessel in which a plasma process is performed is electrically connected via a power feed line to a heater power supply provided outside the processing vessel, provided on the power feed line to reduce or block noises of multiple high frequency powers of different frequencies introduced from the heating element into the power feed line toward the heater power supply, the filter unit comprising:

an air-core solenoid coil provided at an uppermost portion of the filter, when viewed from a side of the heating element, air-core solenoid coil configured to block noises of a single or plural high frequency powers among the multiple high frequency powers except a high frequency power having a lowest frequency;

insulating comb teeth inserted in winding gaps of a first section of the air-core solenoid coil locally at plural positions in a circumferential direction thereof;

a coil tube configured to block winding gaps of a second section of the air-core solenoid coil entirely in the circumferential direction;

a coil having a core connected in series to the air-core solenoid coil, the coil configured to block a noise of the high frequency power having the lowest frequency; and a cylindrical conductor, accommodating or surrounding at least the air-core solenoid coil, configured to form, by being combined with the air-core solenoid coil, a distributed constant line in which parallel resonance occurs at multiple frequencies.

* * * * *